(12) United States Patent
Ikeda et al.

(10) Patent No.: US 11,200,859 B2
(45) Date of Patent: Dec. 14, 2021

(54) DISPLAY DEVICE AND ELECTRONIC DEVICE

(71) Applicant: SEMICONDUCTOR ENERGY LABORATORY CO., LTD., Atsugi (JP)

(72) Inventors: Takayuki Ikeda, Kanagawa (JP); Takahiro Fukutome, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/477,733

(22) PCT Filed: Jan. 10, 2018

(86) PCT No.: PCT/IB2018/050139
§ 371 (c)(1),
(2) Date: Jul. 12, 2019

(87) PCT Pub. No.: WO2018/138590
PCT Pub. Date: Aug. 2, 2018

(65) Prior Publication Data
US 2019/0362683 A1    Nov. 28, 2019

(30) Foreign Application Priority Data
Jan. 24, 2017 (JP) .............................. JP2017-010511

(51) Int. Cl.
*G09G 3/36* (2006.01)
*H01L 27/12* (2006.01)

(52) U.S. Cl.
CPC ......... *G09G 3/3648* (2013.01); *H01L 27/124* (2013.01); *G09G 2300/046* (2013.01)

(58) Field of Classification Search
CPC .......... G09G 3/3648; G09G 2300/046; G09G 2320/103; G09G 2330/021;
(Continued)

(56) References Cited

U.S. PATENT DOCUMENTS

| 5,576,738 A | 11/1996 | Anwyl et al. |
| 5,895,935 A | 4/1999 | Yamazaki et al. |

(Continued)

FOREIGN PATENT DOCUMENTS

| EP | 0645691 A | 3/1995 |
| EP | 0661682 A | 7/1995 |

(Continued)

OTHER PUBLICATIONS

International Search Report (Application No. PCT/IB2018/050139) dated Apr. 24, 2018.
(Continued)

*Primary Examiner* — Bryan Earles
(74) *Attorney, Agent, or Firm* — Fish & Richardson P.C.

(57) ABSTRACT

An electronic device with reduced power consumption is provided. The electronic device has a function of transmitting data. First data and second data are supplied to the electronic device. The electronic device has a function of generating a first hash value from the first data, and transmitting the first data. The electronic device has a function of generating a second hash value from the second data, comparing the first hash value with the second hash value, transmitting the second data when the first hash value is different from the second hash value, and not transmitting the second data when the first hash value is the same as the second hash value.

17 Claims, 24 Drawing Sheets

(58) Field of Classification Search
CPC ....... G09G 2300/0426; G09G 2370/08; G09G 3/2092; G09G 3/3677; G09G 3/3688; G09G 3/20; G09G 3/3233; H01L 51/50; H01L 27/124

See application file for complete search history.

(56) References Cited

U.S. PATENT DOCUMENTS

| | | | |
|---|---|---|---|
| 6,005,559 | A | 12/1999 | Miyamoto |
| 6,198,133 | B1 | 3/2001 | Yamazaki et al. |
| 7,212,649 | B2 | 5/2007 | Watanabe et al. |
| 7,674,650 | B2 | 3/2010 | Akimoto et al. |
| 8,588,580 | B2 | 11/2013 | Tanaka et al. |
| 8,644,620 | B1 * | 2/2014 | Lam .................. G06F 13/10 382/209 |
| 8,732,496 | B2 | 5/2014 | Wyatt |
| 8,737,109 | B2 | 5/2014 | Yamazaki et al. |
| 8,854,286 | B2 | 10/2014 | Yamazaki et al. |
| 9,076,505 | B2 | 7/2015 | Atsumi et al. |
| 9,207,511 | B2 | 12/2015 | Yamazaki et al. |
| 9,520,411 | B2 | 12/2016 | Takahashi et al. |
| 10,061,172 | B2 | 8/2018 | Yamazaki et al. |
| 2010/0312986 | A1 * | 12/2010 | Fujiwara ............... H04L 1/0061 711/216 |
| 2011/0102446 | A1 | 5/2011 | Oterhals et al. |
| 2011/0164027 | A1 | 7/2011 | Grieb |
| 2011/0216043 | A1 | 9/2011 | Tamura et al. |
| 2013/0265294 | A1 * | 10/2013 | Kim ..................... G09G 3/3611 345/214 |
| 2014/0022220 | A1 | 1/2014 | Lee et al. |
| 2015/0228239 | A1 * | 8/2015 | Tanaka ................. G09G 3/3648 345/204 |
| 2015/0242704 | A1 | 8/2015 | Nobori |
| 2016/0247831 | A1 * | 8/2016 | Makita ................ H01L 27/1274 |
| 2017/0162158 | A1 * | 6/2017 | Suyama ............... G09G 3/3648 |

FOREIGN PATENT DOCUMENTS

| | | |
|---|---|---|
| EP | 2515294 A | 10/2012 |
| JP | 07-110672 A | 4/1995 |
| JP | 07-193998 A | 7/1995 |
| JP | 07-209672 A | 8/1995 |
| JP | 09-293879 A | 11/1997 |
| JP | 2003-204429 A | 7/2003 |
| JP | 2007-123861 A | 5/2007 |
| JP | 2011-081337 A | 4/2011 |
| JP | 2011-141522 A | 7/2011 |
| JP | 2011-210242 A | 10/2011 |
| JP | 2012-069932 A | 4/2012 |
| JP | 2013-516653 | 5/2013 |
| JP | 2013-168631 A | 8/2013 |
| JP | 2015-158557 A | 9/2015 |
| KR | 2014-0011701 A | 1/2014 |
| TW | 201245961 | 11/2012 |
| WO | WO-2011/155098 | 12/2011 |

OTHER PUBLICATIONS

Written Opinion (Application No. PCT/IB2018/050139) dated Apr. 24, 2018.
Taiwanese Office Action (Application No. 107101621) dated Aug. 17, 2021.

* cited by examiner

FIG. 6A
FIG. 6B
FIG. 6C
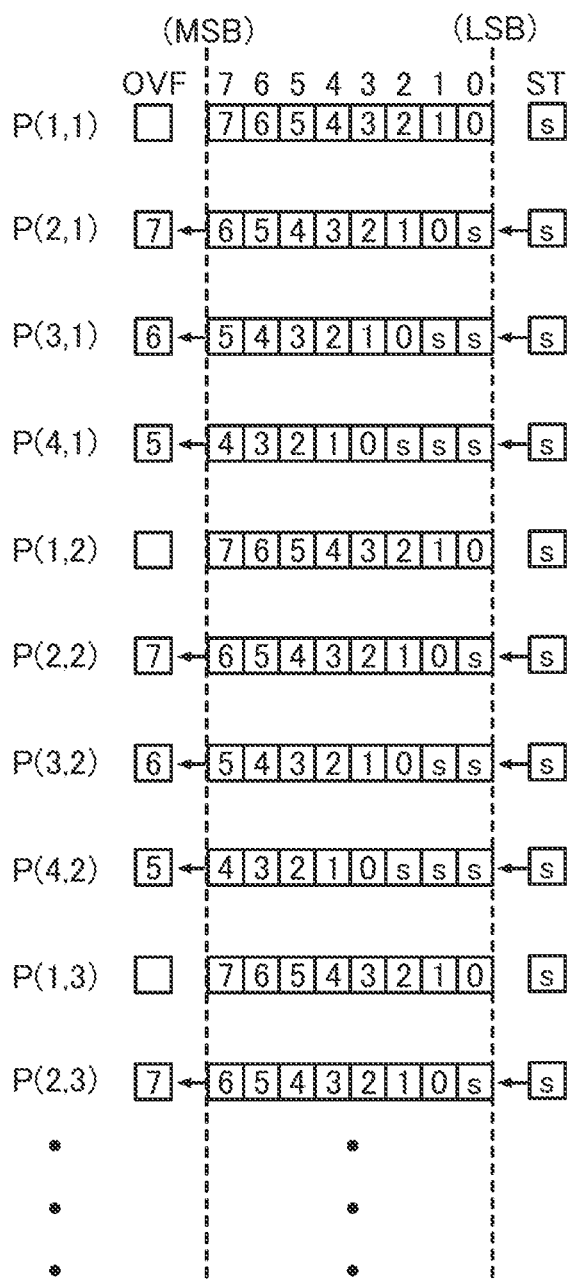
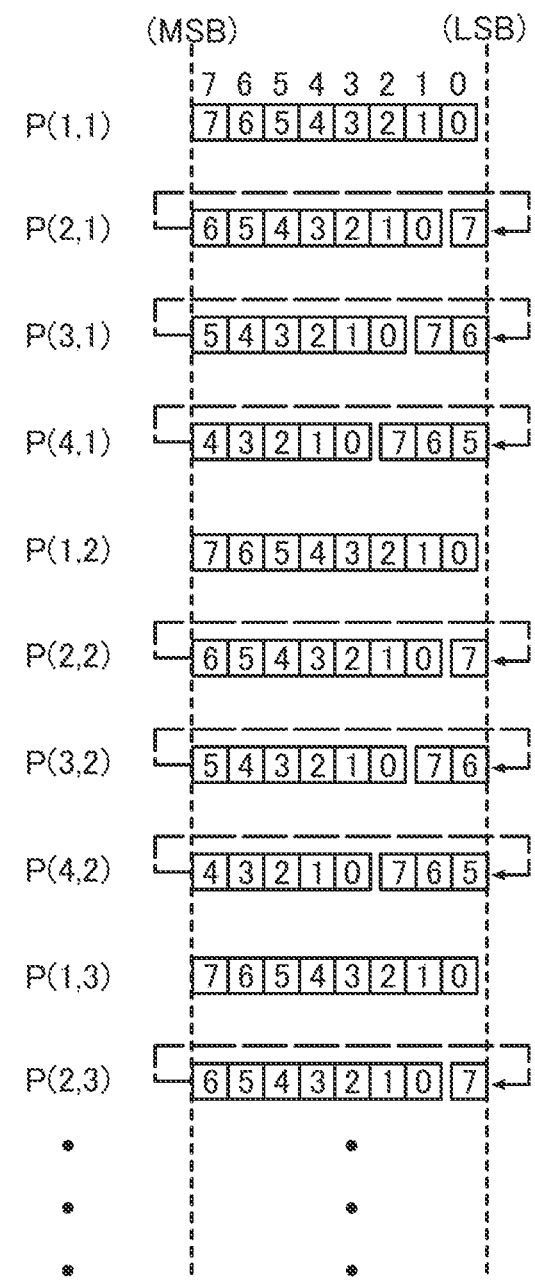

DISPLAY DEVICE AND ELECTRONIC DEVICE

TECHNICAL FIELD

One embodiment of the present invention relates to a display device and an electronic device.

Note that one embodiment of the present invention is not limited to the above technical field. The technical field of one embodiment of the invention disclosed in this specification and the like relates to an object, a method, or a manufacturing method. The present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof.

Note that in this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

BACKGROUND ART

Display devices are used in mobile devices such as smartphones, tablets, and e-book readers, and also used in electronic devices such as monitors, TVs, and digital signage. Long-term use is required for the mobile devices and low power consumption is required for the electronic devices.

A metal oxide that can be applied to a transistor has attracted attention as a technique for achieving lower power consumption. For example, Patent Document 1 discloses a technique for fabricating a transistor with use of a metal oxide such as zinc oxide or an In—Ga—Zn-based oxide. A transistor including a semiconductor layer made of a metal oxide is referred to as an OS transistor.

The OS transistor has an extremely low off-state current. Patent Document 2 discloses a technique for reducing the refresh rate in displaying a still image so that the power consumption of a liquid crystal display can be reduced. Note that in this specification, the aforementioned technique for reducing the power consumption of the display device is referred to as idling stop driving or IDS driving.

Patent document 3 discloses a comparison of programs or data sets with use of hash values.

Another example that has been reported is a memory element including an OS transistor, which is achieved by the low off-state current of the OS transistor. For example, Patent Document 4 discloses an example of using an OS transistor in a dynamic random access memory (DRAM). As another example, Patent Document 5 discloses a nonvolatile memory element including an OS transistor. In this specification, the memory elements including OS transistors are referred to as OS memories. The OS memories have an unlimited rewriting number of times of rewriting and consume low power.

REFERENCE

Patent Document

[Patent Document 1] Japanese Published Patent Application No. 2007-123861
[Patent Document 2] Japanese Published Patent Application No. 2011-141522
[Patent Document 3] PCT International Publication No. 2011/155098
[Patent Document 4] Japanese Published Patent Application No. 2013-168631
[Patent Document 5] Japanese Published Patent Application No. 2012-069932

DISCLOSURE OF INVENTION

Smartphones, tablets, e-book readers, and the like need to save power for long-term use. The power consumption is typically reduced by power gating or clock gating. For display devices, a method of reducing a display refresh rate has been proposed. A processor controlling a peripheral circuit needs to monitor the peripheral circuit for power gating and clock gating. This causes a decrease in the performance of the processor owing to polling or interrupt processing for monitoring the peripheral circuit, leading to increased power consumption.

In addition, display of an electronic device is controlled by a program. That is, a program for controlling smartphones, tablets, e-book readers, monitors, TVs, digital signage, and the like need to control display refresh rates.

In view of the above problems, an object of one embodiment of the present invention is to provide a display device with a novel structure. Another object of one embodiment of the present invention is to adjust a display refresh rate in accordance with display content. Another object of one embodiment of the present invention is to provide an electronic device with reduced power consumption.

Note that the descriptions of these objects do not disturb the existence of other objects. In one embodiment of the present invention, there is no need to achieve all the above objects. Other objects will be apparent from and can be derived from the description of the specification, the drawings, the claims, and the like.

Note that the objects of one embodiment of the present invention are not limited to the above objects. The objects described above do not disturb the existence of other objects. The other objects are the ones that are not described above and will be described below. The other objects that are not described above will be apparent from and can be derived from the description of the specification, the drawings, and the like by those skilled in the art. Note that one embodiment of the present invention is to solve at least one of the aforementioned objects and the other objects.

One embodiment of the present invention is an electronic device configured to transmit data. First data and second data are supplied to the electronic device. The electronic device is configured to generate a first hash value from the first data; transmit the first data; generate a second hash value from the second data; compare the first hash value with the second hash value; and transmit the second data when the first hash value is different from the second hash value, and configured not to transmit the second data when the first hash value is the same as the second hash value.

One embodiment of the present invention is a display device including a display controller and a display panel. The display controller includes a hash generation circuit, a hash control circuit, a frame memory, a comparison circuit, a timing control circuit, and an image processing circuit. First display data is supplied to the hash generation circuit. The hash generation circuit is configured to generate a first hash value and supply the first display data to the frame memory. The hash control circuit is configured to determine the first hash value. The comparison circuit is configured to store the first hash value and activate the timing control circuit. The timing control circuit is configured to activate the image processing circuit so that image processing is performed on the first display data stored in the frame memory, and to transmit the processed first display data from the image processing circuit to the display panel so that display is updated.

The display device with any of the above structures is preferably as follows. Second display data is supplied to the hash generation circuit. The hash generation circuit is configured to generate the second hash value and supply the second display data to the frame memory. The hash control circuit is configured to determine the second hash value. The comparison circuit is configured to compare the stored first hash value with the second hash value, and to store the second hash value and activate the timing control circuit when the first hash value is different from the second hash value. The timing control circuit is configured to activate the image processing circuit so that image processing is performed on the second display data stored in the frame memory, and to transmit the processed second display data from the image processing circuit to the display panel so that display is updated. The comparison circuit is configured to stop operation of the timing control circuit when the first hash value is the same as the second hash value.

The display device with any of the above structures is preferably as follows. The second display data is supplied to the hash generation circuit. The hash generation circuit is configured to generate the second hash value and supply the second display data to the frame memory. The hash control circuit is configured to determine the second hash value. The comparison circuit is configured to compare the stored first hash value with the second hash value, and to store the second hash value and activate the timing control circuit when the first hash value is different from the second hash value. The image processing circuit activated by the timing control circuit is configured to transmit the second display data stored in the frame memory to the display panel so that display is updated. The comparison circuit is configured to stop operation of the timing control circuit when the first hash value is the same as the second hash value.

The display device with any of the above structures is preferably as follows. The display panel includes a plurality of pixels. The pixels further include first coordinate data indicating display positions of the display panel. The hash generation circuit is configured to regularly sample the first coordinate data included in the first display data and generate the first hash value from the sampled first display data. The hash generation circuit is also configured to regularly sample the first coordinate data included in the second display data and generate the second hash value from the sampled second display data.

The display device with any of the above structures is preferably as follows. The hash generation circuit is configured to add a weight coefficient to the first display data and generate the first hash value. The hash generation circuit is also configured to add a weight coefficient to the second display data and generate the second hash value.

The display device with any of the above structures is preferably as follows. The pixel further includes a plurality of sub-pixels. The sub-pixels further include second coordinate data indicating display positions of the display panel. The first display data includes a plurality of first sub-display data. The hash generation circuit is configured to generate a first sub-hash value from the second coordinate data included in the first sub-display data. The second display data includes a plurality of second sub-display data. The hash generation circuit is configured to generate a second sub-hash value from the second coordinate data included in the second sub-display data.

The display device with any of the above structures is preferably as follows. The hash generation circuit is configured to regularly sample the second coordinate data included in the first sub-display data and generate the first sub-hash value. The hash generation circuit is also configured to regularly sample the second coordinate data included in the second sub-display data and generate the second sub-hash value.

The display device with any of the above structures is preferably as follows. The hash generation circuit is configured to add a weight coefficient to the first sub-display data and generate the first sub-hash value. The hash generation circuit is also configured to add a weight coefficient to the second sub-display data and generate the second sub-hash value.

Any of the display devices with the above structures preferably includes a transistor and the transistor preferably includes amorphous silicon in a semiconductor layer.

Any of the display devices with the above structures preferably includes a transistor and the transistor preferably includes polycrystalline silicon in a semiconductor layer.

Any of the display devices with the above structures preferably includes a transistor and the transistor preferably includes a metal oxide in a semiconductor layer.

One embodiment of the present invention is preferably a display module including any of the display devices with the above structures and a touch sensor.

One embodiment of the present invention is preferably an electronic device including any of the display devices with the above structures, or a display module, and an operation key.

In view of the above problems, according to one embodiment of the present invention, a display device with a novel structure can be provided. According to another embodiment of the present invention, a display refresh rate can be adjusted in accordance with display content. According to another embodiment of the present invention, an electronic device with reduced power consumption can be provided.

Note that the effects of one embodiment of the present invention are not limited to the above effects. The effects described above do not disturb the existence of other effects. The other effects are the ones that are not described above and will be described below. The other effects that are not described above will be apparent from and can be derived from the description of the specification, the drawings, and the like by those skilled in the art. Note that one embodiment of the present invention is to have at least one of the aforementioned effects and the other effects. Therefore, one embodiment of the present invention does not have the effects described above in some cases.

BRIEF DESCRIPTION OF DRAWINGS

FIGS. 5A to 5F each illustrate a display panel.

FIG. 6A illustrates a configuration of display data, and FIGS. 6B and 6C each illustrate a method of arithmetic processing.

FIG. 17A illustrates a circuit of a display device and FIGS. 17B1 and 17B2 are top views of pixels.

BEST MODE FOR CARRYING OUT THE INVENTION

Figure 1:
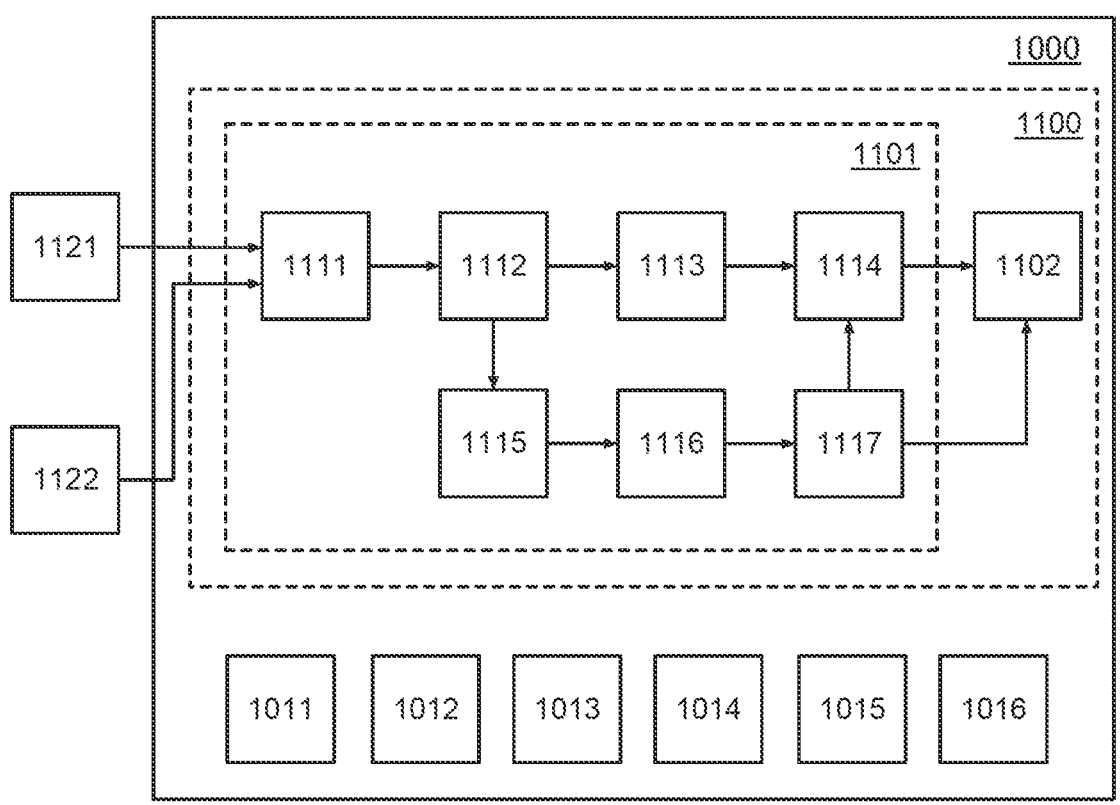
FIG. 1 is a block diagram illustrating a configuration of an electronic device.

Hereinafter, embodiments will be described with reference to drawings. However, the embodiments can be implemented in many different modes, and it will be readily appreciated by those skilled in the art that modes and details thereof can be changed in various ways without departing from the spirit and scope of the present invention. Therefore, the present invention should not be interpreted as being limited to the description of the embodiments below.

In the drawings, the size, the layer thickness, or the region is exaggerated for clarity in some cases, and therefore, is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Also in this specification, terms for explaining arrangement, such as "over" and "under", are used for convenience to describe the positional relation between components with reference to drawings. The positional relation between components is changed as appropriate in accordance with a direction in which each component is described. Thus, the positional relation is not limited to that described with a term used in this specification and can be explained with the other terms as appropriate depending on the situation.

In this specification and the like, a transistor is an element having at least three terminals, a gate, a drain, and a source. The transistor has a channel region between the drain (a drain terminal, a drain region, or a drain electrode) and the source (a source terminal, a source region, or a source electrode), and current can flow through the drain, the channel region, and the source. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in this specification and the like.

In this specification and the like, the term "electrically connected" includes the case where components are connected through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Unless otherwise specified, an off-state current in this specification and the like refers to a drain current of a transistor in an off state (also referred to as a non-conducting state and a cutoff state). Unless otherwise specified, the off state of an n-channel transistor means that the voltage between its gate and source ($V_{gs}$) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to a drain current that flows when the gate-source voltage $V_{gs}$ is lower than the threshold voltage $V_{th}$.

The off-state current of a transistor depends on $V_{gs}$ in some cases. Thus, "the off-state current of a transistor is lower than or equal to I" may mean "there is $V_{gs}$ with which the off-state current of the transistor becomes lower than or equal to I". The off-state current of a transistor may refer to an off-state current at a given $V_{gs}$, at $V_{gs}$ in a given range, at $V_{gs}$ at which a sufficiently low off-state current is obtained, or the like.

As an example, the assumption is made of an n-channel transistor where the threshold voltage $V_{th}$ is 0.5 V and the drain current is $1\times10^{-9}$ A at a voltage $V_{gs}$ of 0.5 V, $1\times10^{-13}$ A at a voltage $V_{gs}$ of 0.1 V, $1\times10^{-19}$ A at a voltage $V_{gs}$ of −0.5 V, and $1\times10^{-22}$ A at a voltage $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it can be said that the off-state current of the transistor is $1\times10^{-19}$ A or lower. Since there is $V_{gs}$ at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value in relation to the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like is used (e.g., a temperature in the range of 5° C. to 35° C.). The state in which the off-state current of a transistor is I or lower may indicate that the off-state current of the transistor at room temperature, 60° C., 85° C., 95° C., 125° C., a temperature at which the reliability of a semiconductor device or the like including the transistor is ensured, or a temperature at which the semiconductor device or the like including the transistor is used (e.g., a temperature in the range of 5° C. to 35° C.) is I or lower at a certain $V_{gs}$.

The off-state current of a transistor depends on a voltage $V_{ds}$ between its drain and source in some cases. Unless otherwise specified, the off-state current in this specification may be an off-state current at $V_{ds}$ of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at $V_{ds}$ at which the reliability of a semiconductor device or the like including the transistor is ensured or $V_{ds}$ used in the semiconductor device or the like including the transistor. The state in which the off-state current of a transistor is lower than or equal to I may indicate that the off-state current of the transistor at $V_{ds}$ of 0.1 V, 0.8 V, 1 V, 1.2 V, 1.8 V, 2.5 V, 3 V, 3.3 V, 10 V, 12 V, 16 V, or 20 V, at $V_{ds}$ at which the reliability of a semiconductor device or the like including the transistor is ensured, or at $V_{ds}$ used in the semiconductor device or the like including the transistor is lower than or equal to I at a certain $V_{gs}$.

In the above description of the off-state current, a drain may be replaced with a source. That is, the off-state current sometimes refers to a current that flows through a source of a transistor in the off state.

In this specification and the like, the term "leakage current" sometimes expresses the same meaning as off-state current. In this specification and the like, the off-state current sometimes refers to a current that flows between a source and a drain when a transistor is off, for example.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

Embodiment 1

In this embodiment, a display device in which a display refresh rate is adjusted with a hash value generated from display data will be described with reference to FIGS. 1 to 4, FIGS. 5A to 5F, and FIGS. 6A to 6C.

FIG. 1 illustrates a configuration of an electronic device 1000. The electronic device 1000 includes a display device 1100, a processor 1011, a memory device 1012, an input device 1013, a clock generation circuit 1014, a speaker 1015, and a microphone 1016. The display device 1100 includes a display controller 1101 and a display panel 1102. The display controller 1101 includes a decoder circuit 1111, a hash generation circuit 1112, a frame memory 1113, an image processing circuit 1114, a hash control circuit 1115, a comparison circuit 1116, and a timing control circuit 1117.

The electronic device 1000 has functions of wireless and wired communication. Hence, the electronic device 1000 transmits and receives data to and from a data server 1121 through wireless or wired communication. For example, in wireless communication, data can be transmitted and received with a carrier wave. In this embodiment, the case where the electronic device 1000 receives display data is described as an example. The data server 1121 may be a mobile device or the like including a memory device.

Wireless communication can be performed using a communication standard developed by IEEE such as a wireless local area network (LAN), Wi-Fi (registered trademark), Bluetooth (registered trademark), or ZigBee (registered trademark).

The electronic device 1000 may be electrically connected to an external memory device 1122. The external memory device 1122 is preferably an HDD, an optical disk, a magnetic disk, a magnetic tape, a nonvolatile memory to which a USB memory can be connected, or an inserted external nonvolatile memory. The external memory device 1122 may be included in the electronic device 1000.

A control program, an application program, and data are stored in the memory device 1012. The processor 1011 has a function of controlling the display device 1100, the memory device 1012, the input device 1013, the clock generation circuit 1014, the speaker 1015, and the microphone 1016 in accordance with the control program or the application program. The memory device 1012 can retain data even after the electronic device 1000 is powered off. This can shorten the time it takes to start up the program when the electronic device 1000 is powered on again.

The memory device 1012 or the frame memory 1113 is preferably an internal memory (e.g., a nonvolatile memory, a static random access memory (SRAM), a DRAM, or an OS memory) or an inserted external nonvolatile memory. Alternatively, the memory device 1012 or the frame memory 1113 may be a work memory (e.g., a nonvolatile memory, an SRAM, a DRAM, or an OS memory) that temporarily stores data or a program downloaded with a communication module.

An electrically erasable and programmable read only memory (EEPROM) or a flash memory, which is a nonvolatile memory, retains data by storing electric charges in what is called a floating gate provided between a channel and a gate. However, in a conventional EEPROM or flash memory, high voltage is needed at the time of injection of charges to the floating gate or removal of charges. Because of this, deterioration of a gate insulating film cannot be avoided and it is not possible to indefinitely repeat write and erase operations.

An OS memory has a memory configuration capable of retaining data even when power supply is stopped, owing to an OS transistor with a low off-state current. The transistor used in an OS memory will be described in detail in Embodiment 6.

Examples of the input device 1013 include a sensor (having a function of measuring or detecting force, displacement, position, speed, acceleration, angular velocity, rotational frequency, distance, light, liquid, magnetism, temperature, a chemical substance, sound, time, hardness, an electric field, current, voltage, electric power, radiation, flow rate, humidity, gradient, oscillation, smell, or infrared rays), a joystick, a keyboard, a hardware button, a pointing device, an imaging device, an audio input device, an eye-gaze input device, and an orientation determination device.

The clock generation circuit 1014 generates a clock that is used in the electronic device 1000. The processor 1011 operates with the clock generated by the clock generation circuit 1014. For example, the clock generation circuit 1014 generates a clock for controlling the display controller 1101. Furthermore, the clock generation circuit 1014 generates a reference clock or the like that is used for generating a clock supplied from the timing control circuit 1117 to the display panel 1102.

The display controller 1101 is described. The decoder circuit 1111 receives data from the data server 1121 or the external memory device 1122, removes a header from the received data, and performs entropy decoding on the data, thereby extracting display data.

The display data is supplied to the hash generation circuit 1112. The hash generation circuit 1112 stores the display data in the frame memory 1113 and generates a hash value from the display data at the same time. The hash control circuit 1115 can detect the breakpoint of each frame of the display data. Accordingly, the hash control circuit 1115 can determine the hash value of each frame.

Here, the following definitions are used for the description. A first hash value is a hash value of first display data that is displayed on the display panel 1102. A second hash value is determined by the hash control circuit 1115. The second hash value represents second display data that is stored in the frame memory 1113, i.e., non-display second display data that has not yet been supplied to the display panel 1102.

The comparison circuit 1116 can store the first hash value. In addition, the comparison circuit 1116 can compare the first hash value with the second hash value. When the compared values are different from each other, the timing control circuit 1117 is operated so that the display panel 1102 can be updated with the second display data. Furthermore, the second hash value is stored in the comparison circuit 1116. In contrast, when the compared values are the same, the timing control circuit 1117 stops operating, and neither the hash value stored in the comparison circuit 1116 nor display of the display panel 1102 is updated.

The timing control circuit 1117 can generate a control signal for updating display of the display panel 1102. The image processing circuit 1114 can perform image processing (e.g., gamma correction, toning, and dimming) on display data stored in the frame memory 1113. For example, in toning, the color temperature in white display can be changed. The color temperature adjusted based on the usage environment can relieve the eyestrain of a user of the electronic device 1000.

The image processing circuit 1114 can supply the image data stored in the frame memory 1113 to the display panel 1102 in synchronization with the control signal generated by the timing control circuit 1117. Hence, display of the display panel 1102 is updated with the second display data stored in the frame memory 1113.

Figure 2:
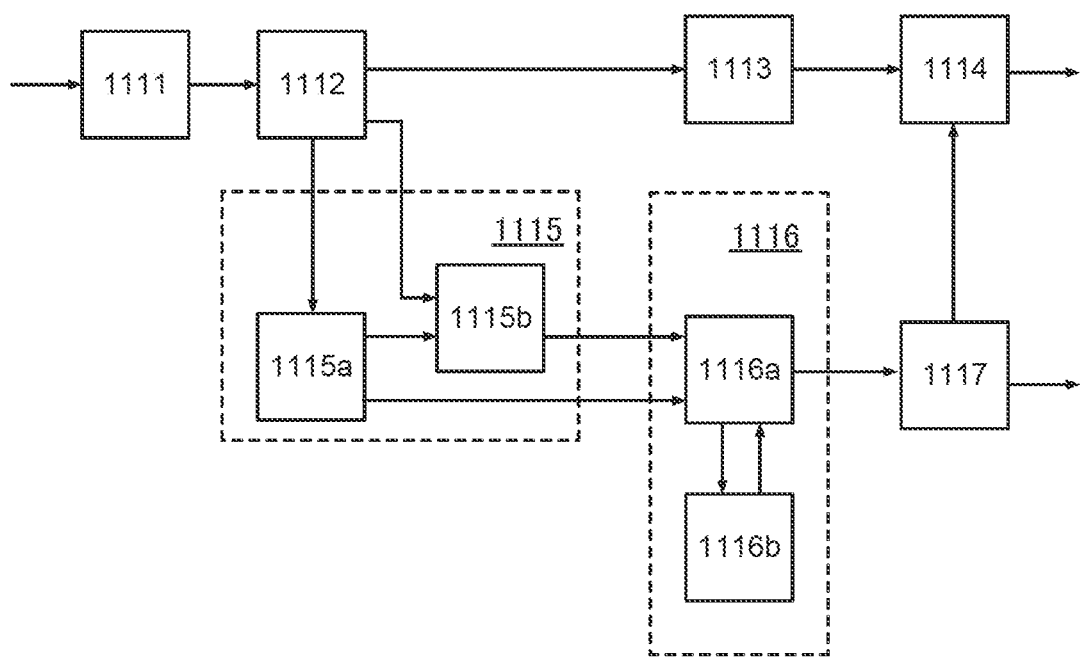
FIG. 2 illustrates a configuration of a display device.

FIG. 2 illustrates a specific configuration of the display controller 1101. The hash control circuit 1115 includes an end-of-frame flag (EOF) detection circuit 1115a, which detects an EOF indicating the end of one frame, and a memory 1115b. The comparison circuit 1116 includes a comparison control circuit 1116a and a memory 1116b.

Description here is continued under the conditions defined in FIG. 1 for description. The second display data is supplied to the hash generation circuit 1112 through the decoder circuit 1111. The hash generation circuit 1112 can generate a hash value from the second display data. The hash generation circuit 1112 can store the second display data in the frame memory 1113. The first display data is displayed on the display panel 1102 and the first hash value is stored in the memory 1116b.

The EOF detection circuit 1115a can detect the EOF of each frame and determine the hash value of the second display data. In other words, the second hash value is determined when the EOF of the second display data is detected. The determined second hash value is stored in the memory 1115b. As the EOF detection circuit, a counter circuit, a comparison circuit, or the like can be used. For example, when the EOF is detected with the counter circuit, the number of times data is written to the frame memory 1113 is counted so that the EOF can be detected. Similarly, when the EOF is detected with the comparison circuit, addresses written to the frame memory 1113 are compared so that the EOF can be detected.

The memory 1116b included in the comparison circuit 1116 stores the first hash value that is generated from the first display data displayed on the display panel 1102. The comparison control circuit 1116a that has received the EOF from the EOF detection circuit 1115a compares the first hash value stored in the memory 1116b with the second hash value stored in the memory 1115b.

When the comparison control circuit 1116a determines that the compared first and second hash values are different, the second hash value is stored in the memory 1116b, and further, the timing control circuit 1117 is activated. The timing control circuit 1117 activates the image processing circuit 1114, to which the display data stored in the frame memory 1113 is supplied. The display data is subjected to image processing by the image processing circuit 1114. The processed display data is transmitted from the image processing circuit 1114 to the display panel 1102 by the timing control circuit 1117, so that display of the display panel 1102 is updated.

Figure 3:
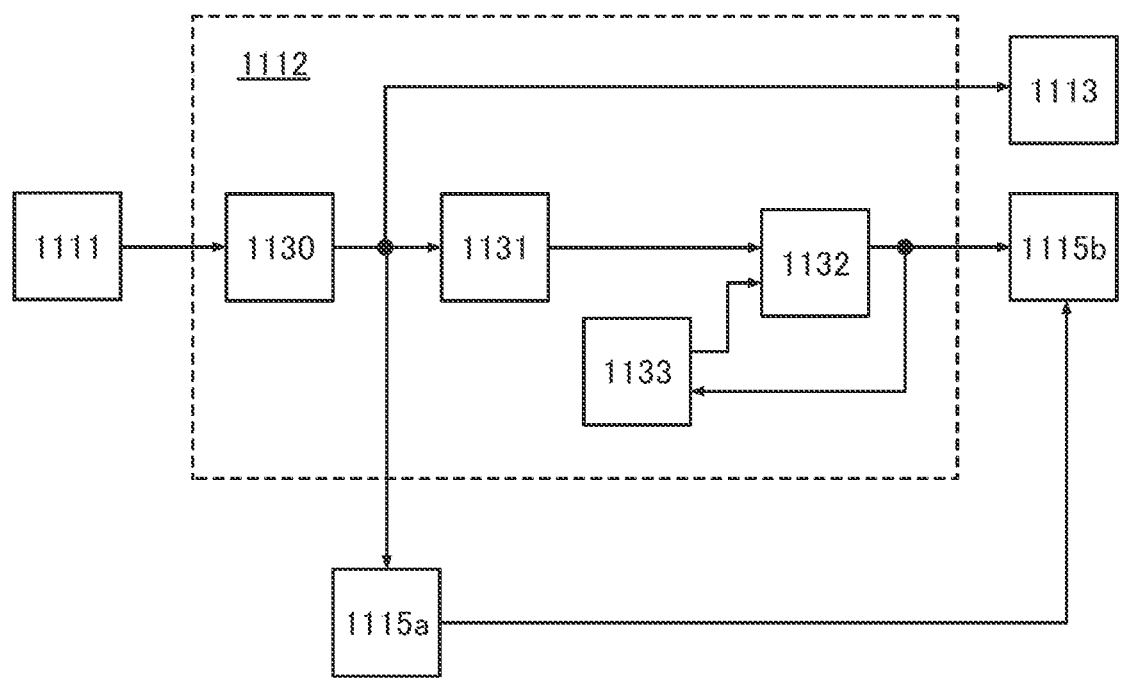
FIG. 3 illustrates a configuration of a display device.

FIG. 3 illustrates a specific configuration of the hash generation circuit 1112. The hash generation circuit 1112 includes a latch circuit 1130, an arithmetic circuit 1131, an adder circuit 1132, and a memory 1133.

The display panel 1102 includes a plurality of pixels, each of which includes a plurality of sub-pixels. Description here is made on an example in which a pixel is composed of three sub-pixels. Note that the number of sub-pixels in a pixel is not limited to three, and may be four or more. In the case where the display panel 1102 displays a grayscale image, each pixel includes one sub-pixel.

Display data extracted by the decoder circuit 1111 is composed of three pieces of sub-display data. The latch circuit 1130 can store three pieces of sub-display data.

The latch circuit 1130 can supply three pieces of sub-display data to the arithmetic circuit 1131. In addition, the latch circuit 1130 can supply data to the frame memory 1113. Furthermore, the latch circuit 1130 can provide the EOF detection circuit 1115a with timing of supplying data to the arithmetic circuit 1131 and the frame memory 1113. The timing is determined by a control signal input to the frame memory 1113, which is used to update display data. For example, the control signal can be a selection signal or a writing signal used to write data to the frame memory 1113.

Thus, the selection signal or the writing signal is suitable for counting the number of times data is written to the frame memory 1113.

The arithmetic circuit 1131 performs an arithmetic operation on each sub-display data, thereby generating first intermediate data. How to generate the first intermediate data will be described in detail with reference to FIGS. 5A to 5F and FIGS. 6A to 6C. The first intermediate data is supplied to the adder circuit 1132. The adder circuit 1132 can add the first intermediate data and second intermediate data that is stored in the memory 1133. The addition result is supplied to the memory 1115*b* as second intermediate data of the sub-display data. Furthermore, the addition result is overwritten in the memory 1133.

The hash generation circuit 1112 performs an arithmetic operation on each sub-display data, thereby determining a sub-hash value. The hash value is generated by combining sub-hash values. Hence, the hash value is stored in the memory 1115*b* at the timing of the EOF detected by the EOF detection circuit 1115*a*. Hereinafter, the second intermediate data determined by the EOF detection circuit 1115*a* is referred to as a sub-hash value. The sub-hash value indicates the integral value of the sub-display data.

Figure 4:
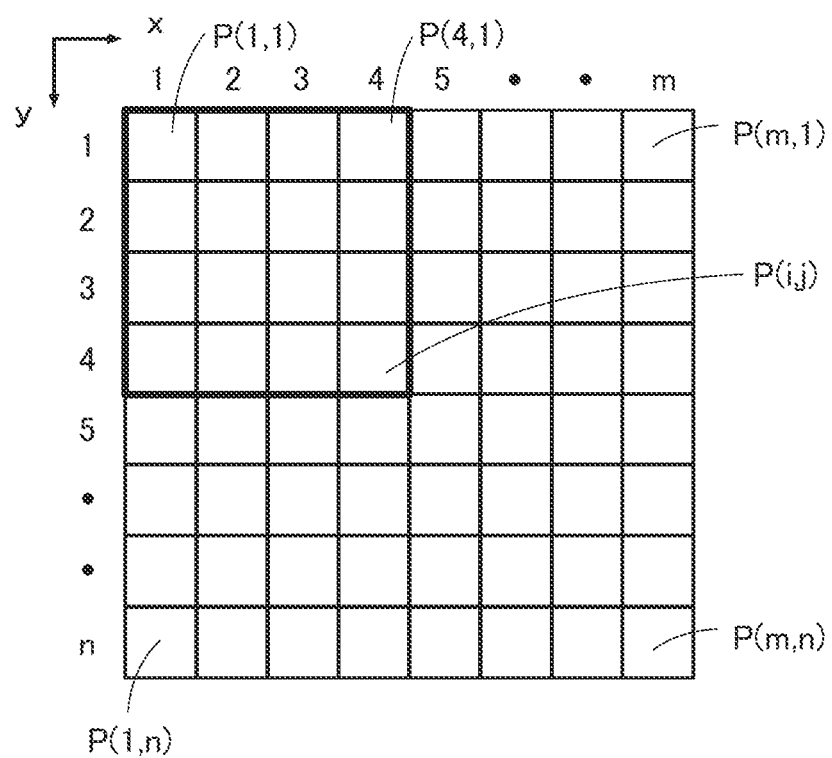
FIG. 4 illustrates a display panel.

The arithmetic operation for generating a hash value by the arithmetic circuit 1131 is described with reference to FIG. 4, FIGS. 5A to 5F, and FIGS. 6A to 6C. As an example, FIG. 4 shows coordinate data of the display panel 1102. The display panel 1102 includes a pixel P(1, 1) to a pixel P(m, n). For example, a pixel P(i, j) has coordinate data (i, j). That is, the coordinate data indicates the position of a pixel that is to be displayed by display data. Note that i is a natural number greater than or equal to 1 and less than or equal to m, and j is a natural number greater than or equal to 1 and less than or equal to n.

Figures 5A, 5B, 5C, 5D, 5E, 5F:
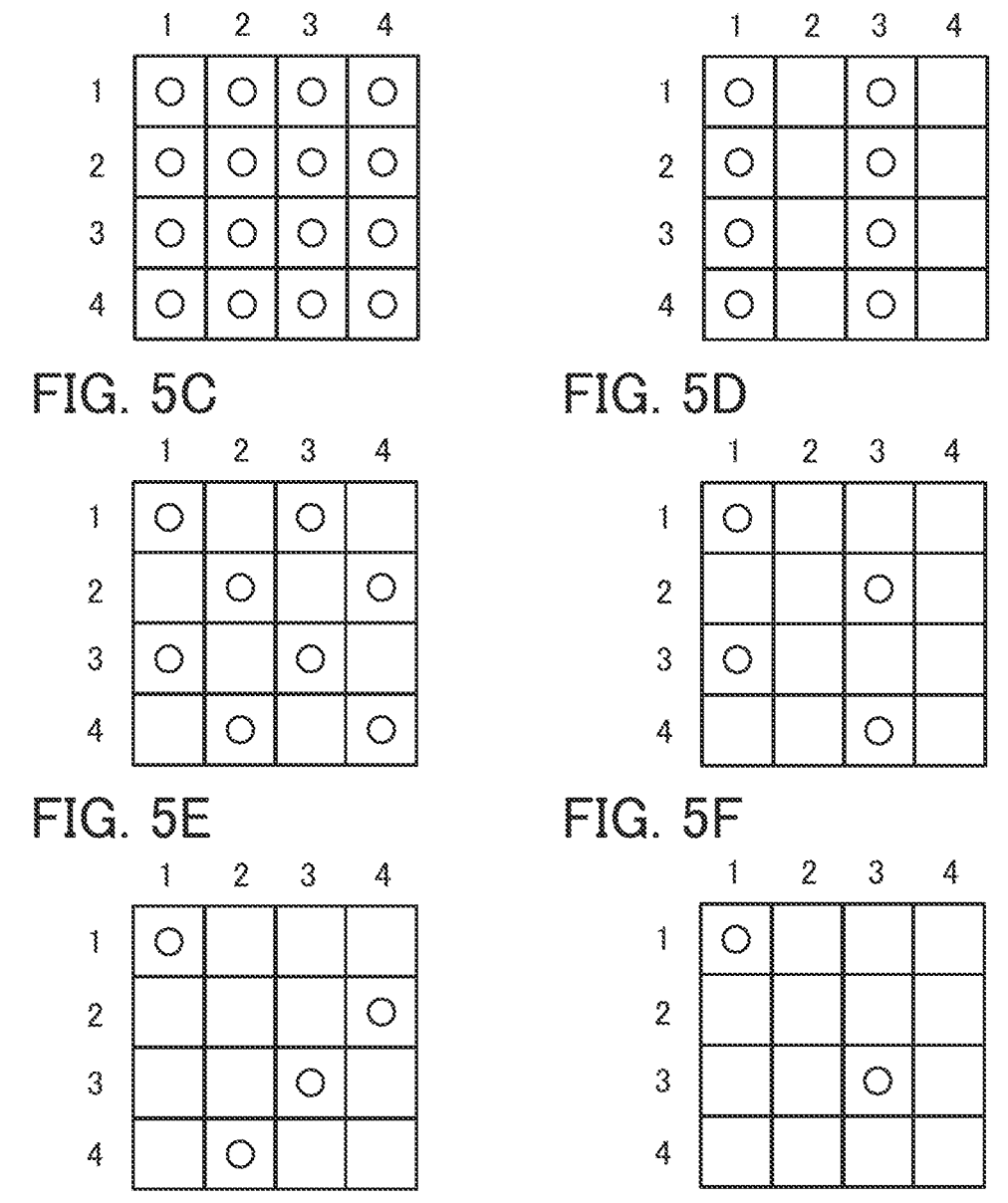

In FIGS. 5A to 5F, the pixels P(1, 1) to P(4, 4) are described for simplicity. FIGS. 5A to 5F show the coordinates of display data that are integrated for generating a hash value. The hash value is preferably obtained by integrating all the display data as shown in FIG. 5A. However, the amount of calculation for integrating all the display data increases in proportion to the number of pixels. Furthermore, power consumption increases in proportion to the number of pixels. The integration of all the display data also arises the following problem: when display data such as a diagram or a letter moves in a vertical, horizontal or oblique direction in parallel, the calculation result of the hash value is not changed.

For example, when the display data of the pixel P(1, 1) moves to the pixel P(2, 2), the display data of both the pixel P(1, 1) and the pixel P(2, 2) are integrated together, so that the obtained hash value is not changed. That is, a change in the display data is difficult to detect from the hash value.

The amount of calculation for obtaining a hash value can be reduced in FIGS. 5B to 5F compared with that in FIG. 5A. Moreover, when the display data of positions indicated in FIGS. 5B to 5F are integrated, a correct hash value can be calculated even when display such as a diagram or a letter moves in parallel.

In the example of FIG. 5B, the display data of odd-numbered x-coordinates are integrated, and therefore, the amount of calculation of a hash value can be reduced by half that in FIG. 5A. The amount of calculation of a hash value can be further reduced by increasing the distance between x-coordinates that are integrated. In that case, however, the hash value is not changed when the display moves in the x-direction in parallel within the distance between calculated x-coordinates.

For example, even when the display data of the pixel P(1, 1) moves to the pixel P(3, 1), the display data of both the pixel P(1, 1) and the pixel P(3, 1) are integrated together, and thus, the obtained hash value is not changed. As another example, in the case where the distance between integrated x-coordinates is different from that in FIG. 5B, e.g., between the pixel P(1, 1) and the pixel P(1, 4), even when the display data of the pixel P(2, 1) moves to the pixel P(3, 1) in parallel, the obtained hash value is not changed because the display data of the pixels P(2, 1) and P(3, 1) are not integrated. That is, a change in the display data is difficult to detect from the hash value.

In addition, when the display content moves in the y-direction, all the coordinates might or might not be integrated for calculating a hash value, in which case the calculated hash value does not reflect the display change. Hence, the range in which the movement of display content does not need to be reflected is preferably determined by the user of the electronic device 1000.

Alternatively, in FIG. 5B, display data of even-numbered x-coordinates may be integrated to obtain a hash value. Further alternatively, display data of odd-numbered or even-numbered y-coordinates may be integrated.

FIG. 5C shows an example in which display data of odd-numbered x- and y-coordinates are integrated and display data of even-numbered x- and y-coordinates are integrated. The amount of calculation of a hash value can be reduced by half that in FIG. 5A. Compared with FIG. 5B, FIG. 5C allows reflecting of a change with parallel movement in the vertical and horizontal directions.

FIG. 5D shows an example in which the number of x-coordinates to be integrated is reduced from that in FIG. 5C. Thus, the amount of calculation of a hash value can be reduced by ¼ that in FIG. 5A. In other words, the arrangement in FIG. 5D is a combination of FIGS. 5B and 5C, allowing both a reduction in the amount of calculation and reflection of a change with parallel movement in oblique directions as well as in the vertical and horizontal directions.

FIG. 5E shows an example in which display data of obliquely aligned coordinates are integrated. The amount of calculation of a hash value can be reduced by ¼ that in FIG. 5A. Furthermore, a hash value can reflect a change with parallel movement in oblique directions as well as in the vertical and horizontal directions.

FIG. 5F shows an example in which the number of coordinates to be integrated is reduced from that in FIG. 5E. The amount of calculation of a hash value can be reduced by ⅛ that in FIG. 5A. Furthermore, a hash value can reflect a change with parallel movement in oblique directions as well as in the vertical and horizontal directions. However, the hash value is not changed when parallel movement in the x-direction is within the distance between calculated x-coordinates. The same applies to the y-coordinates.

For example, even when the display data of the pixel P(1, 1) moves to the pixel P(3, 3) in parallel, the display data of both the pixel P(1, 1) and the pixel P(3, 3) are integrated together, and thus, the obtained hash value is not changed. As another example, in the case where the integrated x-coordinates have a distance, e.g., between the pixel P(2, 2) and the pixel P(4, 4), even when the display data of the pixel P(2, 2) moves to the pixel P(4, 4) in parallel, the obtained hash value is not changed because the display data of the pixels P(2, 2) and P(4, 4) are not integrated. That is, a change in the display data is difficult to detect from the hash value.

In FIGS. 5B to 5F, the integrated coordinate data have a regular interval. This enables the arithmetic circuit 1131 to determine the integrated coordinate data easily. The coordinate data shown in FIGS. 5B to 5F are examples and there is no limitation on the position of coordinates to be integrated. Furthermore, the regular intervals shown in FIGS. 5B to 5F are preferably changed to different regular intervals when applied to a wider area, e.g., from the pixel P(1, 1) to the pixel P(i,j).

A method of adding a weight coefficient to the arithmetic processing of the arithmetic circuit 1131 is described with reference to FIGS. 6A to 6C. For example, when display content moves in parallel, a weight coefficient is added to the first intermediate data, so that a hash value accurately reflecting a change in display content can be calculated.

FIG. 6A shows an example of display data. The display data is composed of three pieces of sub-display data of R, G, and B. Each sub-display data has a weight coefficient, so that different first intermediate data can be generated for the display data even with the same grayscale.

An example of integrating sub-display data displayed as shown in FIG. 5A is described here for simplicity. The display data is composed of three colors of R, G, and B and the data width is 24 bits. Thus, each sub-display data has an 8 (=24/3)-bit width. Each bit of the sub-display data is denoted by 0 (LSB) to 7 (MSB). Binary data is stored in bits of 0 to 7 to achieve a display grayscale.

FIGS. 6A to 6C show a method of adding a weight coefficient to the sub-display data. The weight coefficient preferably add a different weight with bit shift. Furthermore, an overflow bit is generated by bit shift, and a calculation result of a sub-hash value differs depending on whether the overflow bit is lost (FIG. 6B) or reused (FIG. 6C). That is, the sub-hash value is preferably calculated by shifting the sub-display data to left (one-bit shift to left doubles the sub-display data).

When the sub-display data is shifted to left in FIG. 6B, for example, the bit 7 overflows as shown in the pixel P(2, 1), i.e., the overflow bit 7 is lost. In addition, when the sub-display data is shifted to left, a bit s is added as a stored bit in the position of the bit 0. The bit s is either "0" or "1". The bit shift processing of the sub-display data enables the sub-display data of different display positions to be converted into different first intermediate data.

For example, when display content moves in parallel in the x-direction, the arithmetic circuit 1131 can generate different first intermediate data for the same sub-display data because a weight coefficient is added to the sub-display data.

FIG. 6C shows an example of adding a weight coefficient by a method different from that in FIG. 6B. First, as in FIG. 6B, sub-display data is shifted to left to generate first intermediate data. The bit 7 overflows when the data is shifted to left as shown in the pixel P(2, 1). However, the bit 7 that has overflowed is not lost but is added to the bit 0. In other words, the sub-display data is looped to generate the first intermediate data, preventing data loss.

Thus, in the hash generation circuit 1112, a hash value reflecting a change in display content can be generated by integrating first intermediate data that are generated with different weight coefficients for different display positions. Although the example of shifting one bit to left is shown above, the shift direction, the shift width of each coordinate, and the shift amount in a bit width of the sub-display data are not limited and are preferably determined as appropriate.

FIGS. 6B and 6C show an example of adding a different weight coefficient to a different coordinate pixel; however, there is no particular limitation on the method of adding a weight coefficient. Different methods of adding a weight coefficient may be combined. The method of generating a hash value is not limited to the above method, and a hash value may be generated using an error-detecting code. For example, any of the following known functions may be used: an error-detecting code such as CRC32, and a cryptographic hash function such as MD5, RIPEMD-256, SHA-1, SHA-256, or SHA-384.

FIGS. 5A to 5F show the method of generating a hash value accurately reflecting a change in display content by selecting display positions where sub-display data are integrated. In FIGS. 6A to 6C, a weight coefficient is further added to the sub-display data, so that a hash value reflecting a change in display content can be generated even when the amount of calculation is reduced. Hence, whether the display content of the display panel 1102 is the same as the display data of the next frame can be determined by a comparison of hash values of the display data. When the hash values indicating the display content are different from each other, the memory 1116b is updated with the second hash value so as to update the display of the display panel. When the hash values indicating the display content are the same, neither the hash value retained in the memory 1116b nor the display of the display panel is updated.

In the display controller 1101, display is updated when hash values of display data are different from each other, whereas idling stop driving can be performed without the need for monitoring by a processor when the hash values of display data are the same.

Power for updating display of a display panel increases with a larger number of pixels of the display panel. Therefore, the display device shown in this embodiment produces an effect of reducing power consumption when applied to a full high-definition device (1920×1080 pixels) rather than a high-definition device (1366×768 pixels). A further reduction in power consumption is achieved when the display device of this embodiment is applied to a 4K device (3840× 2160 pixels) rather than the full high-definition device. Moreover, a remarkable effect of reducing power consumption can be produced when the display device of this embodiment is applied to an 8K device (7680×4320 pixels).

The structure and method described in this embodiment can be implemented by being combined as appropriate with any of the other structures and methods described in the other embodiments.

Embodiment 2

In this embodiment, a display device of one embodiment of the present invention will be described.

One embodiment of the present invention is a display device including a display region (also referred to as a pixel portion) where a plurality of pixels are arranged in a matrix. In the pixel portion, a plurality of wirings to which a selection signal is supplied (also referred to as gate lines or scan lines) and a plurality of wirings to which a signal written to a pixel (also referred to as a video signal or the like) is supplied (also referred to as source lines, signal lines, data lines, or the like) are provided. The gate lines are provided parallel to one another and the source lines are provided parallel to one another. The gate lines and the source lines intersect with each other.

One pixel includes at least one transistor and one display element. The display element includes a conductive layer that functions as a pixel electrode. The conductive layer is electrically connected to one of a source and a drain of the transistor. A gate of the transistor is electrically connected to a gate line. The other of the source and the drain is electrically connected to a source line.

Here, a direction in which the gate lines extend is called a row direction or a first direction, and a direction in which the source lines extend is called a column direction or a second direction.

The same selection signal is preferably supplied to two adjacent gate lines. That is, selection periods of these gate lines are preferably the same. In the following description, three gate lines are regarded as a group. Note that the number of gate lines that are selected at the same time is not limited to three, and four or more gate lines may be regarded as a group.

In the case where the same selection signal is supplied to three gate lines, three pixels which are adjacent to each other in the column direction are concurrently selected. Thus, different source lines are connected to the three pixels. That is, three source lines are arranged for each column.

Here, the middle source line among the three source lines is preferably positioned to overlap with the conductive layer that functions as a pixel electrode. This can reduce the distance between pixel electrodes.

Furthermore, part of a semiconductor layer of a transistor is preferably positioned between the outer source line and the middle source line among the three source lines. For example, in the case where first to third source lines are arranged in this order, part of a semiconductor layer of a transistor connected to the first source line and part of a semiconductor layer of a transistor connected to the second source line are positioned between the first source line and the second source line. Furthermore, part of a semiconductor layer of a transistor connected to the third source line is positioned between the second source line and the third source line. Thus, a node between each source line and each semiconductor layer can be prevented from intersecting with another source line. Accordingly, the parasitic capacitance between the source lines can be reduced.

With such a configuration, one horizontal period can be longer than the conventional one. For example, in the case where three gate lines are supplied with the same selection signal, the length of one horizontal period can be three times the length of the conventional one. Furthermore, since the parasitic capacitance between the source lines can be reduced, the load of the source lines can be reduced. Thus, even a significantly high-resolution display device such as a 4K display or an 8K display can be operated with use of a transistor with a low field-effect mobility. The above-described configurations can be applied to a large display device with a diagonal screen size of 50 inches or larger, 60 inches or larger, or 70 inches or larger.

A more specific example of the display device is described below with reference to drawings.

[Structure Example of Display Device]

Figure 7:
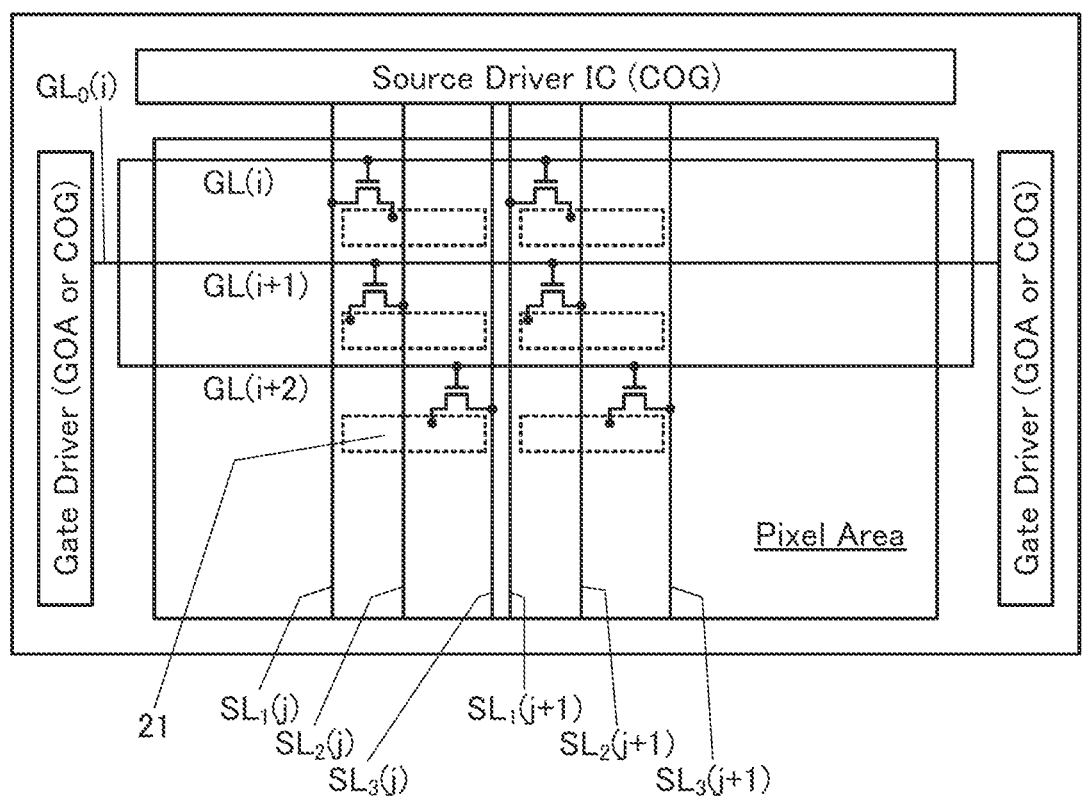
FIG. 7 illustrates a structure example of a display device.

FIG. 7 is a block diagram of the display device 1100 of one embodiment of the present invention. The display device 1100 includes a pixel region (a display region), a source driver, and a gate driver.

FIG. 7 shows an example in which the display device 1100 includes two gate drivers with a pixel region positioned therebetween. A plurality of gate lines $GL_0$ are connected to the two gate drivers. In FIG. 7, an i-th gate line $GL_0(i)$ is illustrated. The gate line $GL_0(i)$ is electrically connected to three gate lines (a gate line $GL(i)$, a gate line $GL(i+1)$, and a gate line $GL(i+2)$). Accordingly, the three gate lines are supplied with the same selection signal.

A plurality of source lines are connected to the source driver. Three source lines are provided for one pixel column. FIG. 7 illustrates three source lines (a source line $SL_1(j)$, a source line $SL_2(j)$, and a source line $SL_3(j)$) for the j-th pixel column and three source lines (a source line $SL_1(j+1)$, a source line $SL_2(j+1)$, and a source line $SL_3(j+1)$) for the (j+1)-th pixel column.

One pixel includes at least one transistor and one conductive layer 21 that functions as a pixel electrode of a display element. Each pixel corresponds to one color. In the case where color display is performed by utilizing mixture of light emitted from a plurality of pixels, the pixel can be called a sub-pixel.

Furthermore, pixels arranged in the column direction preferably emit light of the same color. In the case where a liquid crystal element is used as a display element, the pixels arranged in the column direction are provided with coloring layers that transmit light of the same color to overlap with the liquid crystal elements.

Here, it is preferable that part of the inner source line (the source line SLAM among three source lines for one pixel column overlap with the conductive layer 21. Moreover, it is preferable that the source line $SL_2(j)$ be arranged at the center portion of the conductive layer 21 so as to be apart from the other source lines. For example, the distance between the source line $SL_1(j)$ and the source line $SL_2(j)$ is preferably about equal to the distance between the source line $SL_2(j)$ and the source line $SL_3(j)$. As a result, the parasitic capacitance between the source lines can be reduced more effectively and the load of each source line can be reduced.

As a method for achieving high resolution with use of a transistor including amorphous silicon or the like which has difficulty in having a high field-effect mobility, there is a method in which a display region of a display device is divided into a plurality of pixel regions and driven. In the above method, a boundary portion between divided pixel regions might be visually recognized owing to variations in characteristics of a driver circuit, which decreases the visibility in some cases. In addition, image processing or the like for dividing in advance image data to be input is necessary; thus, a large-scale image processing device that can operate at a high speed is required.

In contrast, the display device of one embodiment of the present invention can be driven without dividing the display region even when including a transistor with a relatively low field-effect mobility.

Although FIG. 7 illustrates an example in which a source driver is disposed along a side of a pixel region, source drivers may be disposed along facing two sides of the pixel region such that the pixel region is sandwiched between the source drivers.

Figure 8:
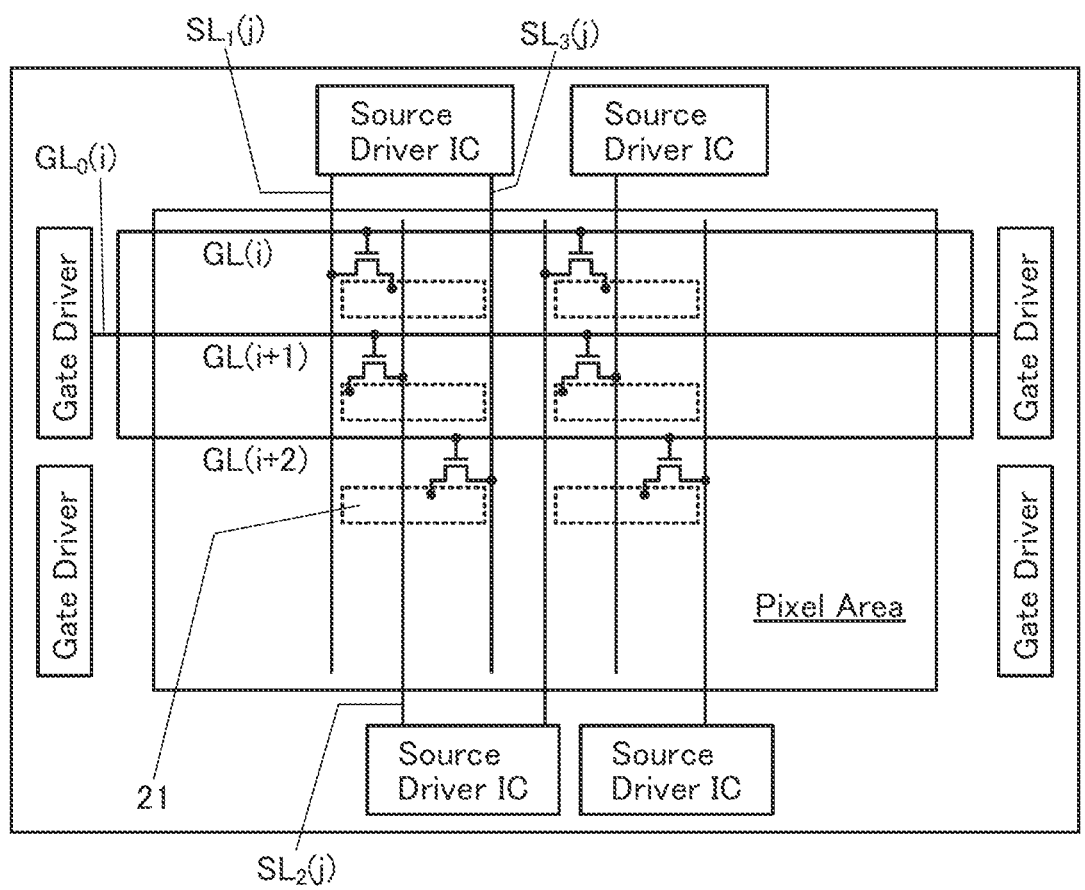
FIG. 8 illustrates a structure example of a display device.

In the example shown in FIG. 8, a source driver IC connected to odd-numbered source lines among a plurality of source lines provided in a pixel region and a source driver IC connected to even-numbered source lines are positioned to face each other. That is, the plurality of source lines arranged in the row direction are alternately connected to different source driver ICs. FIG. 8 shows the example in which the source line $SL_1(j)$ and the source line $SL_3(j)$ are connected to the source driver IC on the upper side, and the source line $SL_2(j)$ is connected to the source driver IC on the lower side. With such a structure, display unevenness due to a potential drop caused by wiring resistance can be suppressed even in a large display device. In the structure of FIG. 8, the area where the source driver IC is positioned can be larger than that in the structure of FIG. 7. Thus, the distance between two adjacent source driver ICs can be large, improving the manufacturing yield.

[Pixel Structure Example]

An example of the structure of a pixel arranged in a pixel region of the display device 1100 is described below.

Figure 9A:
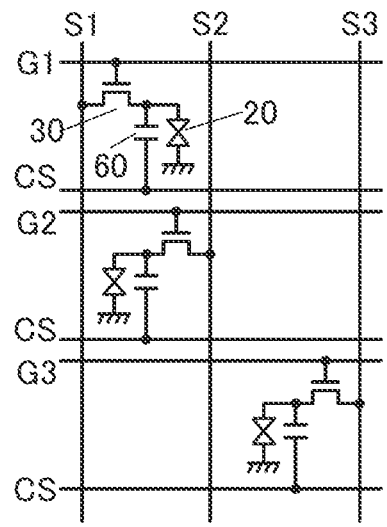
FIGS. 9A to 9D each illustrate a structure example of a display device.

FIG. 9A is a circuit diagram including three pixels arranged in the column direction.

Each pixel includes a transistor 30, a liquid crystal element 20, and a capacitor 60.

Wirings S1 to S3 are source lines, and wirings G1 to G3 are gate lines. A wiring CS is electrically connected to one electrode of the capacitor 60, and a certain potential is applied to the wiring CS.

A pixel is electrically connected to any one of the wirings S1 to S3 and any one of the wirings G1 to G3. As an example, a pixel connected to the wiring S1 and the wiring G1 is described. In the transistor 30, a gate is electrically connected to the wiring G1, one of a source and a drain is electrically connected to the wiring S1, and the other of the source and the drain is electrically connected to the other electrode of the capacitor 60 and one electrode (pixel electrode) of the liquid crystal element 20. A common potential is supplied to the one electrode of the capacitor 60.

Figure 9B:
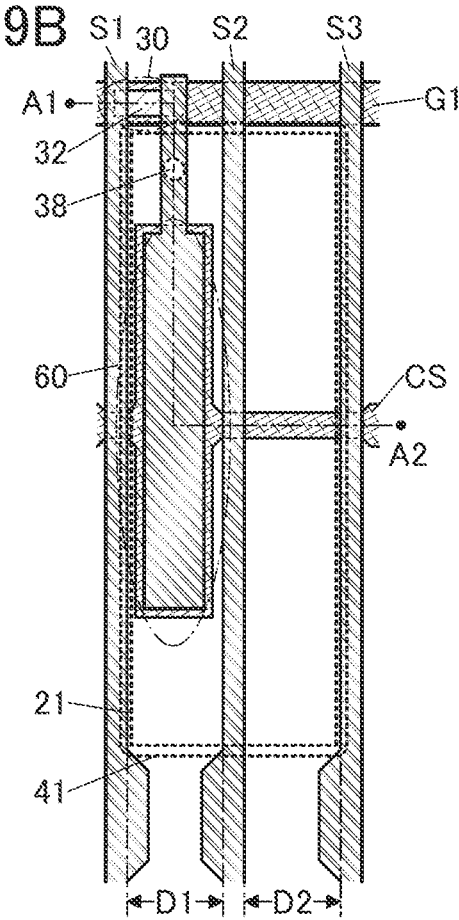

FIG. 9B illustrates an example of a layout of the pixel connected to the wiring S1 and the wiring G1.

As illustrated in FIG. 9B, the wiring G1 and the wiring CS extend in the row direction (the lateral direction), and the wirings S1 to S3 extend in the column direction (the longitudinal direction).

In the transistor 30, a semiconductor layer 32 is provided over the wiring G1, and part of the wiring G1 functions as a gate electrode. Part of the wiring S1 functions as one of a source electrode and a drain electrode. The semiconductor layer 32 includes a region positioned between the wiring S1 and the wiring S2.

The other of the source electrode and the drain electrode of the transistor 30 is electrically connected to the conductive layer 21 that functions as a pixel electrode through a connection portion 38. A coloring layer 41 is provided in a position overlapping with the conductive layer 21.

The conductive layer 21 includes a portion overlapping with the wiring S2. It is preferable that the conductive layer 21 not overlap with the wiring S1 and the wiring S3 which are positioned along the both sides. Thus, the parasitic capacitance of the wiring S1 and the wiring S3 can be reduced.

When the distance between the wiring S1 and the wiring S2 is called a distance D1 and the distance between the wiring S2 and the wiring S3 is called a distance D2, the distance D1 is preferably about equal to the distance D2. For example, the ratio of the distance D2 to the distance D1 (i.e., the value of D2/D1) is 0.8 to 1.2, preferably 0.9 to 1.1. This can reduce the parasitic capacitance between the wiring S1 and the wiring S2 and the parasitic capacitance between the wiring S2 and the wiring S3.

Owing to a wide distance between wirings, dust or the like that adheres between the wirings in the manufacturing process is easily removed by washing, improving the yield. When the washing is performed with a line washing apparatus, it is preferable that during the washing, a substrate be moved along the direction in which the wiring S1 and the like extend, in which case dust can be removed more easily.

Furthermore, in FIG. 9B, part of the wirings S1 to S3 and part of the wiring CS each have a portion wider than the other portion. Thus, the wiring resistance can be small.

Figure 9C:
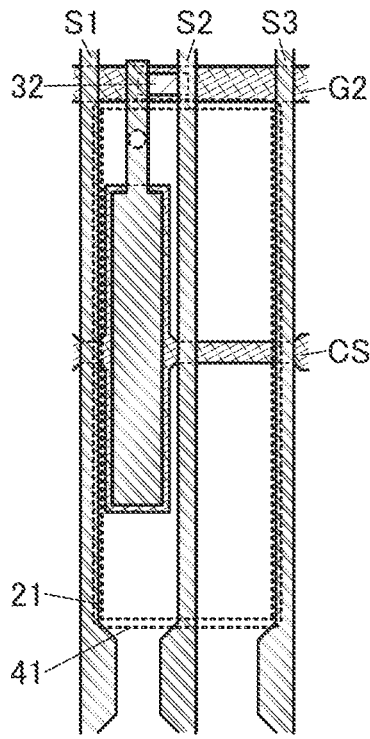
Figure 9D:
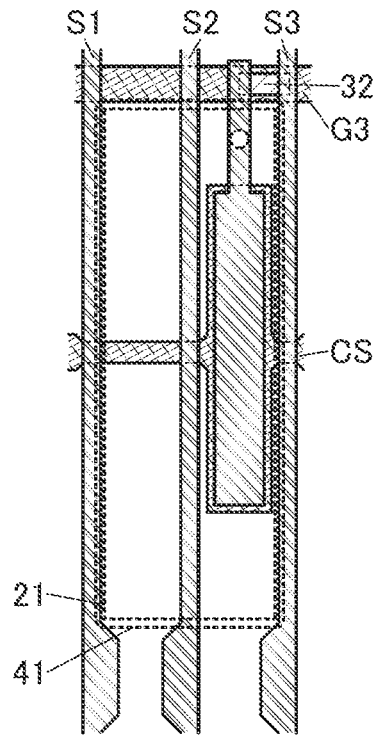

FIGS. 9C and 9D illustrate examples of layouts of the pixel connected to the wiring G2 and the pixel connected to the wiring G3, respectively.

In FIG. 9C, the semiconductor layer 32 provided over the wiring G2 is electrically connected to the wiring S2, and has a region positioned between the wiring S1 and the wiring S2.

In FIG. 9D, the semiconductor layer 32 provided over the wiring G3 is electrically connected to the wiring S3, and has a region positioned between the wiring S2 and the wiring S3.

The pixels illustrated in FIGS. 9B to 9D preferably emit light of the same color. The coloring layers 41 that transmit light of the same color can be provided in a region overlapping with the conductive layer 21. Pixels that are adjacent in the column direction can have the same structure as those of FIGS. 9B to 9D; however, the coloring layers 41 emit light of different colors.

[Cross-Sectional Structure Example]

An example of the cross-sectional structure of the display device will be described below.

[Cross-Sectional Structure Example 1]

Figure 10:
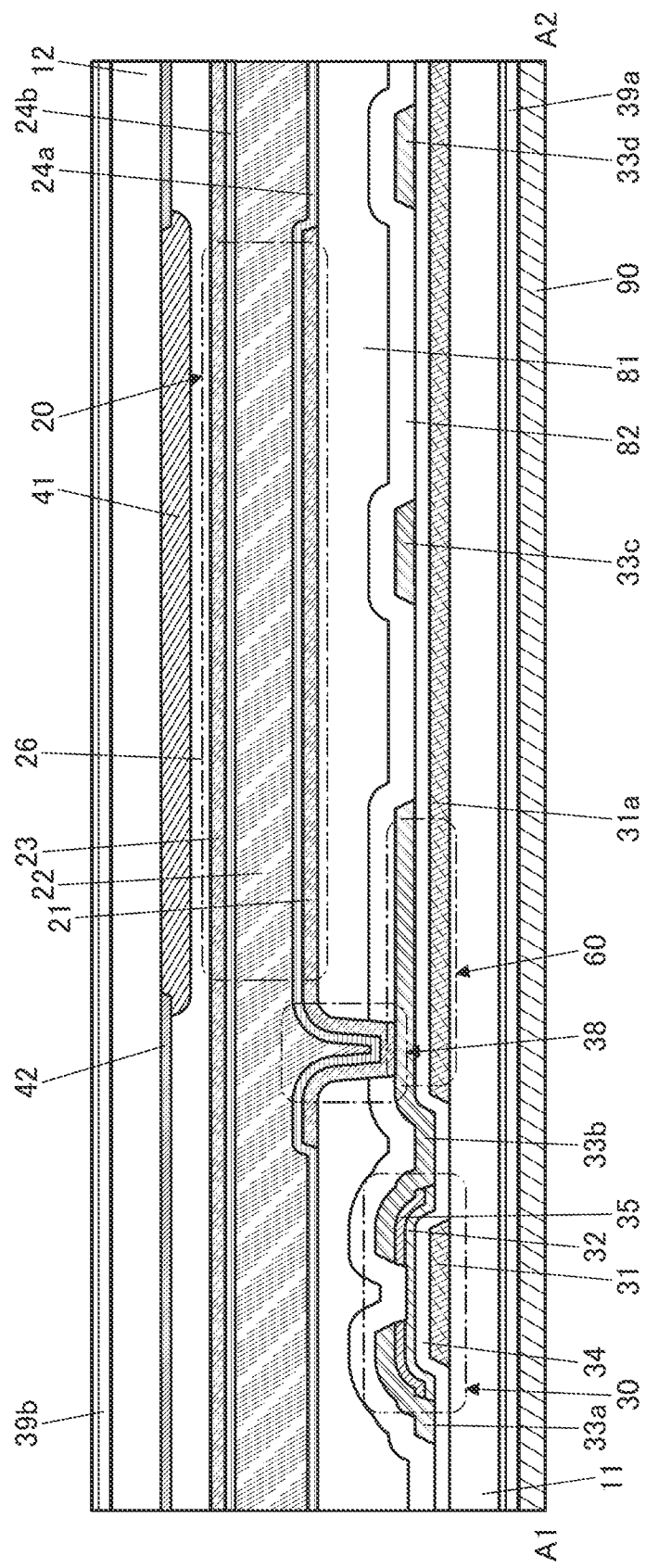
FIG. 10 illustrates a structure example of a display device.

FIG. 10 illustrates an example of a cross section along line A1-A2 in FIG. 9B. Here, an example where a transmissive liquid crystal element 20 is used as a display element is shown. In FIG. 10, a substrate 12 side is a display surface side.

In the display device 1100, a liquid crystal 22 is provided between a substrate 11 and the substrate 12. The liquid crystal element 20 includes the conductive layer 21 provided on the substrate 11 side, a conductive layer 23 provided on the substrate 12 side, and the liquid crystal 22 provided between the conductive layers 21 and 23. Furthermore, an alignment film 24a is provided between the liquid crystal 22 and the conductive layer 21 and an alignment film 24b is provided between the liquid crystal 22 and the conductive layer 23.

The conductive layer 21 functions as a pixel electrode. The conductive layer 23 functions as a common electrode or the like. The conductive layer 21 and the conductive layer 23 each have a function of transmitting visible light. Thus, the liquid crystal element 20 is a transmissive liquid crystal element.

The coloring layer 41 and a light-blocking layer 42 are provided on a surface of the substrate 12 on the substrate 11 side. An insulating layer 26 is provided to cover the coloring layer 41 and the light-blocking layer 42, and the conductive layer 23 is provided to cover the insulating layer 26. The coloring layer 41 is provided in a region overlapping with the conductive layer 21. The light-blocking layer 42 is provided to cover the transistor 30 and the connection portion 38.

A polarizing plate 39a is located outward from the substrate 11, and a polarizing plate 39b is located outward from the substrate 12. Furthermore, a backlight unit 90 is located outward from the polarizing plate 39a.

The transistor 30, the capacitor 60, and the like are provided over the substrate 11. The transistor 30 functions as a selection transistor of a pixel. The transistor 30 is electrically connected to the liquid crystal element 20 through the connection portion 38.

The transistor 30 illustrated in FIG. 10 is what is called a channel-etched bottom-gate transistor. The transistor 30 includes a conductive layer 31 functioning as a gate electrode, an insulating layer 34 functioning as a gate insulating layer, the semiconductor layer 32, a pair of impurity semiconductor layers 35 functioning as a source and a drain region, and a pair of conductive layers 33a and 33b functioning as a source electrode and a drain electrode. A region of the semiconductor layer 32 overlapping with the conductive layer 31 functions as a channel formation region. The semiconductor layer 32 is in contact with the impurity semiconductor layer 35 and the impurity semiconductor layer 35 is in contact with the conductive layer 33a or 33b.

Note that the conductive layer 31 corresponds to part of the wiring G1 in FIG. 9B, and the conductive layer 33a corresponds to part of the wiring S1. Furthermore, a conductive layer 31a, a conductive layer 33c, and a conductive layer 33d, which are described later, correspond to the wiring CS, the wiring S2, and the wiring S3, respectively.

A semiconductor containing silicon is preferably used for the semiconductor layer 32. For example, amorphous silicon, microcrystalline silicon, polycrystalline silicon, or the like can be used. Amorphous silicon is particularly preferable because it can be formed over a large substrate with a high yield. A display device of one embodiment of the present invention can perform favorable display even with a transistor including amorphous silicon having a relatively low field-effect mobility. As amorphous silicon, hydrogenated amorphous silicon (denoted by a-Si:H in some cases) in which dangling bonds are terminated by hydrogen is preferably used.

The impurity semiconductor film to form the impurity semiconductor layer 35 is formed using a semiconductor to which an impurity element imparting one conductivity type is added. In the case where the transistor is an n-channel transistor, for example, silicon to which P or As is added is given as a semiconductor to which an impurity element imparting one conductivity type is added. In the case where the transistor is a p-channel transistor, for example, it is possible to add B as the impurity element imparting one conductivity type; however, it is preferable to use an n-channel transistor. Note that the impurity semiconductor layer 35 may be formed using an amorphous semiconductor or a crystalline semiconductor such as a microcrystalline semiconductor.

The capacitor 60 includes the conductive layer 31a, the insulating layer 34, and the conductive layer 33b. Furthermore, the conductive layer 33c and the conductive layer 33d are provided over the conductive layer 31a with the insulating layer 34 provided therebetween.

An insulating layer 82 and an insulating layer 81 are stacked to cover the transistor 30 and the like. The conductive layer 21 functioning as a pixel electrode is provided over the insulating layer 81. In the connection portion 38, the conductive layer 21 is electrically connected to the conductive layer 33b through an opening in the insulating layers 81 and 82. The insulating layer 81 preferably functions as a planarization layer. The insulating layer 82 preferably functions as a protective film that inhibits diffusion of impurities or the like to the transistor 30 and the like. The insulating layer 82 can be formed using an inorganic insulating material, and the insulating layer 81 can be formed using an organic insulating material, for example.

[Cross-Sectional Structure Example 2]

In the above example, a vertical electric field mode liquid crystal element in which a pair of electrodes are provided over and under a liquid crystal is used as the liquid crystal element: the structure of the liquid crystal element is not limited thereto and any of a variety of liquid crystal elements can be used.

Figure 11:
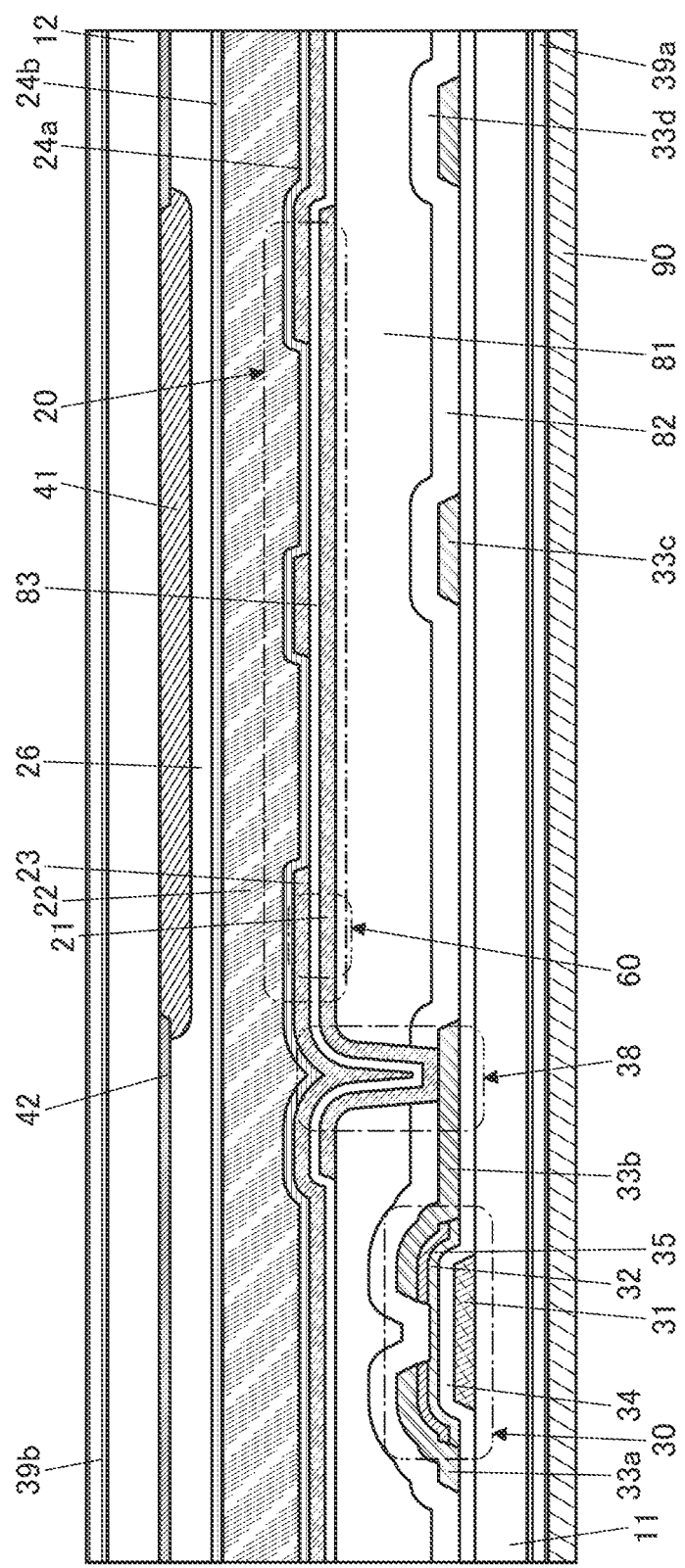
FIG. 11 illustrates a structure example of a display device.

FIG. 11 is a schematic cross-sectional view of a display device including a liquid crystal element using a fringe field switching (FFS) mode.

The liquid crystal element 20 includes the conductive layer 21 functioning as a pixel electrode and the conductive layer 23 overlapping with the conductive layer 21 with an insulating layer 83 provided therebetween. The conductive layer 23 has a slit-like or comb-like top surface.

In such a structure, a capacitor, which can be used as the capacitor 60, is formed in a region where the conductive layer 21 and the conductive layer 23 overlap with each other. Thus, the area occupied by a pixel can be reduced, leading to a high-definition display device. Accordingly, the aperture ratio can be improved.

Here, the smaller the number of photolithography steps in a manufacturing process of a display device is, i.e., the smaller the number of photomasks is, the lower the manufacturing cost can be.

For example, the structure illustrated in FIG. 10 can be manufactured through five photolithography steps, i.e., a formation step of the conductive layer 31 and the like, a formation step of the semiconductor layer 32 and the impurity semiconductor layer 35, a formation step of the conductive layer 33a and the like, a formation step of the opening to be the connection portion 38, and a formation step of the conductive layer 21, among the steps on the substrate 11 side. That is, a back plane substrate can be manufactured with five photomasks. On the other hand, on the substrate 12 (counter substrate) side, an ink-jet method, a screen printing method, or the like is preferably used as the formation methods of the coloring layer 41 and the light-blocking layer 42, in which case a photomask is unnecessary. For example, in the case where three-color coloring layers 41 and the light-blocking layer 42 are provided, four photomasks can be reduced compared with the case where these are formed by a photolithography process.

The above is the description of the cross-sectional structure examples.

[Structure of Transistor]

Structure examples of a transistor different from the above are described below.

Figure 12A:
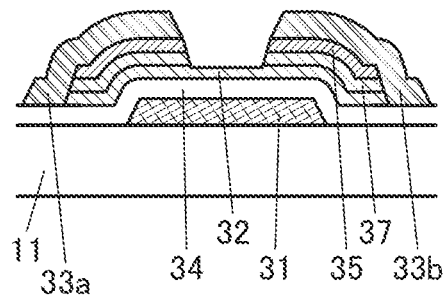
FIGS. 12A to 12F each illustrate a structure example of a display device.

A transistor illustrated in FIG. 12A includes a semiconductor layer 37 between the semiconductor layer 32 and the impurity semiconductor layer 35.

The semiconductor layer 37 may be formed using the same semiconductor film as the semiconductor layer 32. The semiconductor layer 37 can function as an etching stopper for preventing the semiconductor layer 32 from being removed at the time of etching of the impurity semiconductor layer 35. Although FIG. 12A illustrates an example where the semiconductor layer 37 is divided into a right portion and a left portion, part of the semiconductor layer 37 may cover a channel formation region of the semiconductor layer 32.

Furthermore, the semiconductor layer 37 may contain an impurity at a concentration lower than that in the impurity semiconductor layer 35. Thus, the semiconductor layer 37 can function as a lightly doped drain (LDD) region and can suppress a hot-carrier degradation produced when the transistor is driven.

Figure 12B:
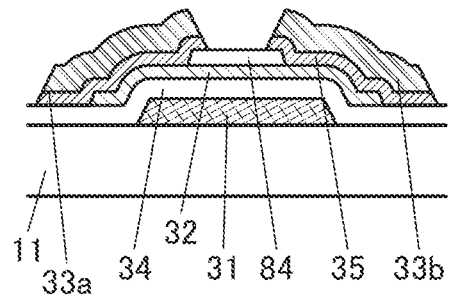

In a transistor illustrated in FIG. 12B, an insulating layer 84 is provided over a channel formation region of the semiconductor layer 32. The insulating layer 84 functions as an etching stopper at the time of etching of the impurity semiconductor layer 35.

Figure 12C:
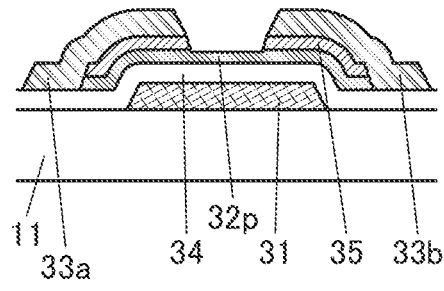

A transistor illustrated in FIG. 12C includes a semiconductor layer 32p instead of the semiconductor layer 32. The semiconductor layer 32p includes a semiconductor film having high crystallinity. For example, the semiconductor layer 32p includes a polycrystalline semiconductor or a single crystal semiconductor. Thus, a transistor having a high field-effect mobility can be provided.

Figure 12D:
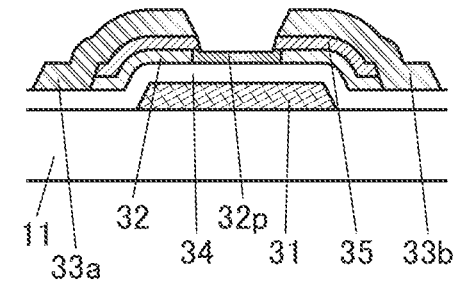

A transistor illustrated in FIG. 12D includes the semiconductor layer 32p in a channel formation region of the semiconductor layer 32. For example, the transistor illustrated in FIG. 12D can be formed by irradiating a semiconductor film to be the semiconductor layer 32 with laser light or the like so that crystallization is caused locally. Thus, a transistor having a high field-effect mobility can be provided.

Figure 12E:
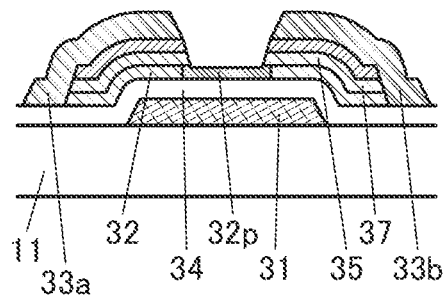

A transistor illustrated in FIG. 12E includes the semiconductor layer 32p having crystallinity in a channel formation region of the semiconductor layer 32 of the transistor illustrated in FIG. 12A.

Figure 12F:
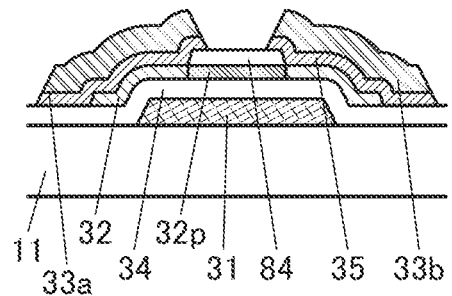

A transistor illustrated in FIG. 12F includes the semiconductor layer 32p having crystallinity in a channel formation region of the semiconductor layer 32 of the transistor illustrated in FIG. 12B.

The above is the description of the structure example of the transistor.

[Components]

The above-described components are described below.

<Substrate>

A material having a flat surface can be used as the substrate included in the display panel. The substrate on the side from which light from the display element is extracted is formed using a material transmitting the light. For example, a material such as glass, quartz, ceramics, sapphire, or an organic resin can be used.

The weight and thickness of the display panel can be reduced by using a thin substrate. A flexible display panel can be obtained by using a substrate that is thin enough to have flexibility. Alternatively, glass or the like that is thin enough to have flexibility can be used as the substrate. Alternatively, a composite material where glass and a resin material are attached to each other with an adhesive layer may be used.

<Transistor>

The transistor includes a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor can be used. A top-gate transistor or a bottom-gate transistor may also be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferred that a semiconductor having crystallinity be used, in which case deterioration of the transistor characteristics can be suppressed.

For example, silicon can be used as a semiconductor in which a channel of the transistor is formed. In particular, amorphous silicon is preferably used as silicon, in which case a transistor can be formed over a large substrate with a high yield, achieving excellent productivity.

Furthermore, silicon having crystallinity such as microcrystalline silicon, polycrystalline silicon, or single crystal silicon can be used. In particular, polycrystalline silicon can be formed at a lower temperature than single crystal silicon and has higher field-effect mobility and higher reliability than amorphous silicon.

Alternatively, a metal oxide may be used for the semiconductor layer of the transistor. A transistor including a metal oxide in a semiconductor layer is known to have a low off-state current. When a transistor with a low off-state current is used as a selection transistor in a pixel, display quality hardly deteriorates even when a display refresh rate is long. Accordingly, a still image can be displayed with a reduced display refresh rate, decreasing power consumption. The display controller 1101 in Embodiment 1 is suitable for controlling the selection transistor including a metal oxide in the semiconductor layer. The transistor including the metal oxide in the semiconductor layer will be described in detail in Embodiment 6.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In some cases, the top-gate transistor is particularly preferable when polycrystalline silicon, single crystal silicon, or the like is employed.

<Conductive Layer>

As materials for the gates, the source, and the drain of a transistor, and the conductive layers functioning as the wirings and electrodes included in the display device, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because it increases controllability of a shape by etching.

As a light-transmitting conductive material that can be used for the gate, source, and drain of the transistor and the conductive layers such as the wirings and electrodes included in the display device, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. In the case of using the metal material or the alloy material (or the nitride thereof), the thickness is set small enough to be able to transmit light. A stacked film of any of the above materials can be used for the conductive layers. For example, a stacked film of indium tin oxide and an alloy of silver and magnesium is preferably used because it can increase the conductivity. They can also be used for conductive layers such as wirings and electrodes included in the display device, and conductive layers (e.g., a conductive layer functioning as a pixel electrode or a common electrode) included in a display element.

<Insulating Layer>

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

<Liquid Crystal Element>

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes; for example, other than the VA mode, a twisted nematic (TN) mode, an in-plane switching (IPS) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode can be used.

The liquid crystal element controls the transmission or non-transmission of light utilizing an optical modulation action of a liquid crystal. Note that the optical modulation action of the liquid crystal is controlled by an electric field applied to the liquid crystal (including a horizontal electric field, a vertical electric field, or an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. The blue phase is a liquid crystal phase, which is generated just before a cholesteric phase changes into an isotropic phase when the temperature of a cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition containing a liquid crystal exhibiting a blue phase and a chiral material has a short response time and optical isotropy, which eliminates the need for an alignment process and reduces the viewing angle dependence. Since the alignment film does not need to be provided, rubbing treatment is not necessary; accordingly, electrostatic discharge damage caused by the rubbing treatment can be prevented, reducing defects and damage of a liquid crystal display device in the manufacturing process.

Examples of the liquid crystal element include a transmissive liquid crystal element, a reflective liquid crystal element, and a semi-transmissive liquid crystal element.

In one embodiment of the present invention, a transmissive liquid crystal element is particularly suitable.

In the case where a transmissive or semi-transmissive liquid crystal element is used, two polarizing plates are provided such that a pair of substrates are sandwiched therebetween. Furthermore, a backlight is provided on the outer side of the polarizing plate. The backlight may be a direct-below backlight or an edge-light backlight. The direct-below backlight including a light-emitting diode (LED) is preferably used because local dimming is easily performed to improve contrast. The edge-light backlight is preferably used because the thickness of a module including the backlight can be reduced.

When the edge-light backlight is turned off, see-through display can be performed.

<Coloring Layer>

Examples of a material that can be used for the coloring layers include a metal material, a resin material, and a resin material containing a pigment or dye.

<Light-Blocking Layer>

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure including a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the descriptions of the components.

At least part of this embodiment can be implemented in combination with any of the other embodiments described in this specification as appropriate.

Embodiment 3

Described in this embodiment are examples of a method of crystallization for polycrystalline silicon which can be used for a semiconductor layer of a transistor and a laser crystallization apparatus.

To form polycrystalline silicon layers having favorable crystallinity, it is preferable that an amorphous silicon layer be provided over a substrate and crystallized by laser irradiation. For example, the substrate is moved while the amorphous silicon layer is irradiated with a linear beam, so that polycrystalline silicon layers can be formed in desired regions over the substrate.

The throughput of a method using a linear beam is relatively preferable. On the other hand, the method tends to produce variations in crystallinity owing to a change in the output of laser light and a change in the beam profile caused by the output change because laser light is moved relative to a region and is emitted to the region a plurality of times. For example, when a semiconductor layer crystallized by the above method is used for a transistor included in a pixel of a display device, a random stripe pattern due to the variation in the crystallinity is seen in some cases at the time of displaying an image.

The length of the linear beam is ideally greater than or equal to the length of a side of the substrate; however, the length of the linear beam is limited by an output of a laser oscillator and the structure of an optical system. Thus, it is practical to irradiate a large substrate with the laser light by turning back the laser light in a substrate plane. Consequently, there is a region irradiated with the laser light a plurality of times. Since the crystallinity of such a region is likely to be different from that of the other region, display unevenness is sometimes caused in the region.

To avoid such a problem, an amorphous silicon layer formed over a substrate may be crystallized by local laser irradiation. Local laser irradiation easily forms polycrystalline silicon layers with small variation in crystallinity.

Figure 13A:
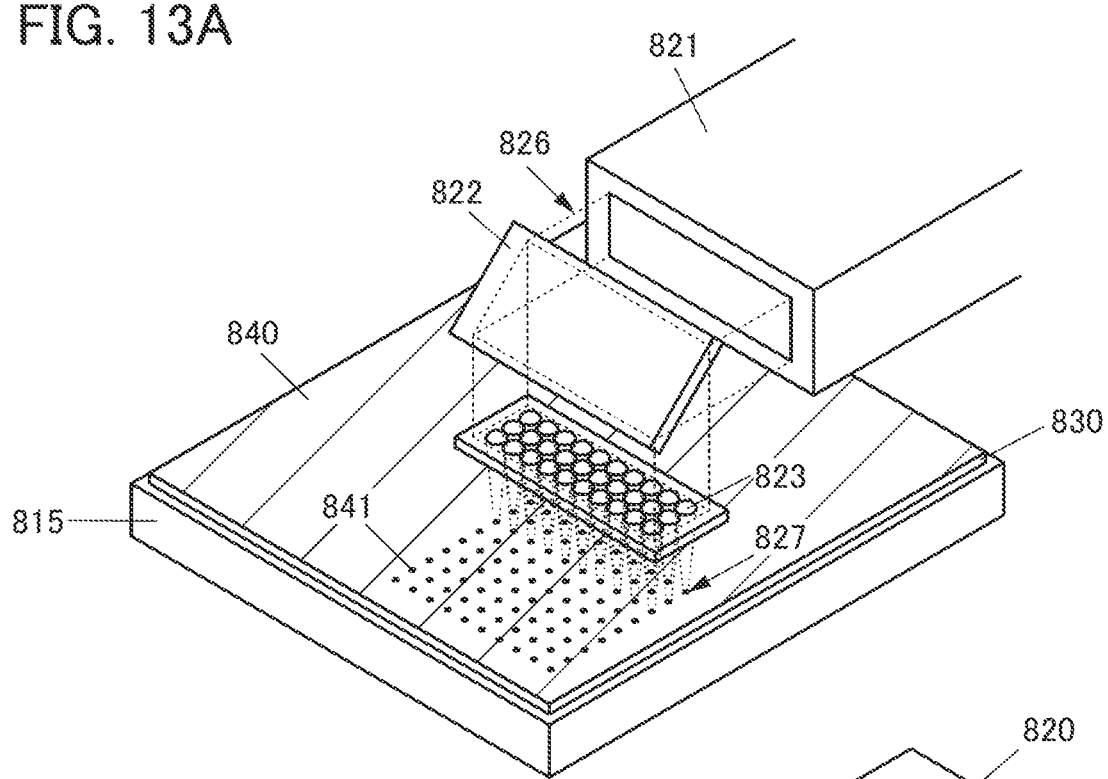
FIGS. 13A and 13B illustrate a laser irradiation method and a laser crystallization apparatus.

FIG. 13A illustrates a method of locally irradiating an amorphous silicon layer formed over a substrate with laser light.

Laser light 826 emitted from an optical system unit 821 is reflected by a mirror 822 and enters a microlens array 823. The microlens array 823 collects the laser light 826 to form a plurality of laser beams 827.

A substrate 830 over which an amorphous silicon layer 840 is formed is fixed to a stage 815. The amorphous silicon layer 840 is irradiated with the plurality of laser beams 827, so that a plurality of polycrystalline silicon layers 841 can be formed at the same time.

Microlenses of the microlens array 823 are preferably provided with a pixel pitch of a display device. Alternatively, they may be provided at intervals of an integral multiple of the pixel pitch. In either of the cases, polycrystalline silicon layers can be formed in regions corresponding to all pixels by repeating laser irradiation and movement of the stage 815 in the X direction or the Y direction.

For example, when the microlens array 823 includes M rows and N columns (M and N are natural numbers) of microlenses arranged with a pixel pitch, laser irradiation is performed at a predetermined start position first, so that M rows and N columns of polycrystalline silicon layers can be formed. Then, the stage 815 is moved by N columns in the row direction and laser irradiation is performed, so that M rows and N columns of polycrystalline silicon layers 841 can be further formed. Consequently, M rows and 2N columns of polycrystalline silicon layers 841 can be obtained. By repeating the steps, a plurality of polycrystalline silicon layers 841 can be formed in desired regions. In the case where laser irradiation is performed by turning back the laser light, the following steps are repeated: the stage 815 is moved by N columns in the row direction; laser irradiation is performed; the stage 815 is moved by M rows in the column direction; and laser irradiation is performed.

Note that even when a method of performing laser irradiation while the stage 815 is moved in one direction is employed, polycrystalline silicon layers can be formed with a pixel pitch by adjusting the oscillation frequency of the laser light and the moving speed of the stage 815 properly.

The size of the laser beam 827 can be an area in which the whole semiconductor layer of a transistor is included, for example. Alternatively, the size can be an area in which the whole channel region of a transistor is included. Further alternatively, the size can be an area in which part of a channel region of a transistor is included. The size can be selected from them depending on required electrical characteristics of a transistor.

Note that in the case of a display device including a plurality of transistors in a pixel, the size of the laser beam 827 can be an area in which the whole semiconductor layer of each transistor in a pixel is included. Alternatively, the size of the laser beam 827 may be an area in which the whole semiconductor layers of transistors in a plurality of pixels are included.

Figure 14A:
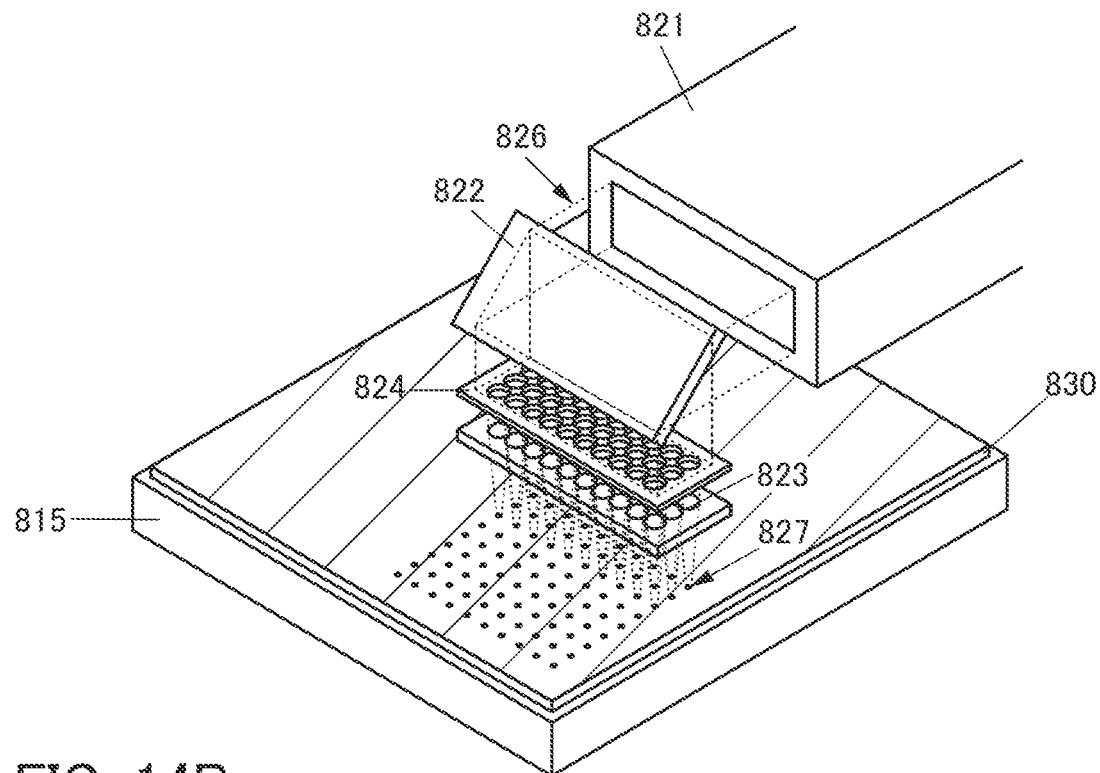
FIGS. 14A and 14B illustrate a laser irradiation method.
Figure 14B:
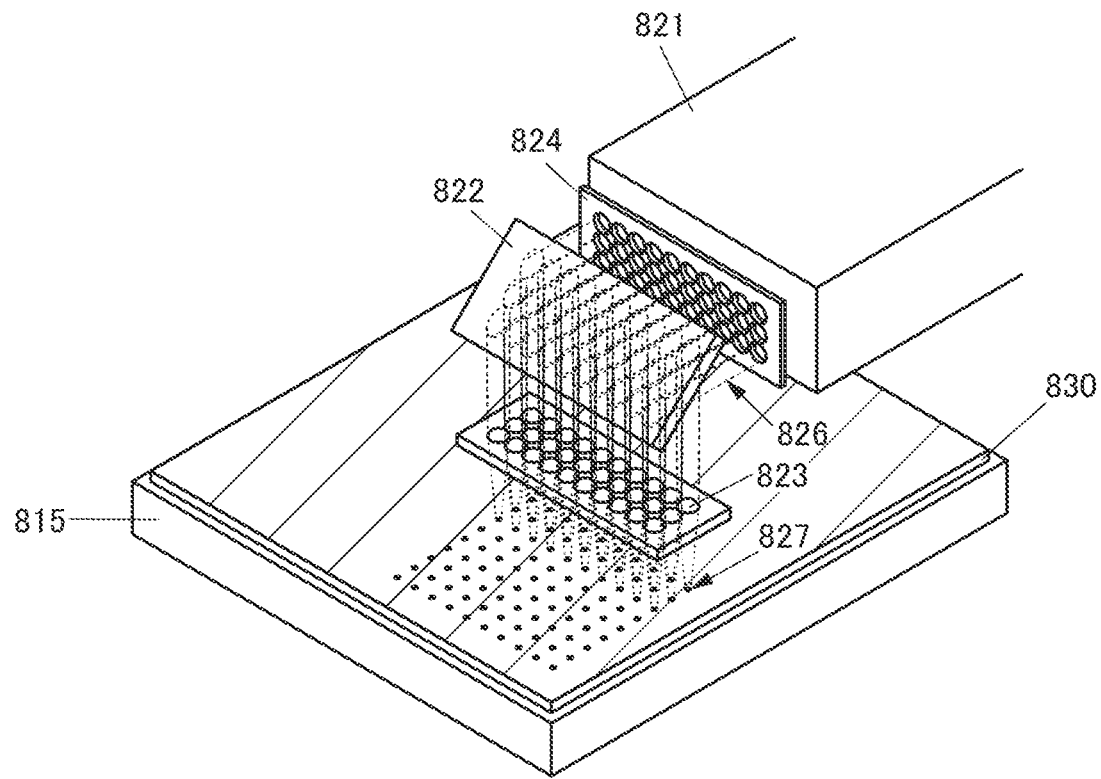

As illustrated in FIG. 14A, a mask 824 may be provided between the mirror 822 and the microlens array 823. The mask 824 includes a plurality of openings corresponding to respective microlenses. The shape of the opening can be reflected by the shape of the laser beam 827; as illustrated in FIG. 14A, the laser beam 827 having a circular shape can be obtained in the case where the mask 824 includes circular openings. The laser beam 827 having a rectangular shape can be obtained in the case where the mask 824 includes rectangular openings. The mask 824 is effective in the case where only a channel region of a transistor is crystallized, for example. Note that the mask 824 may be provided between the optical system unit 821 and the mirror 822 as illustrated in FIG. 14B.

Figure 13B:
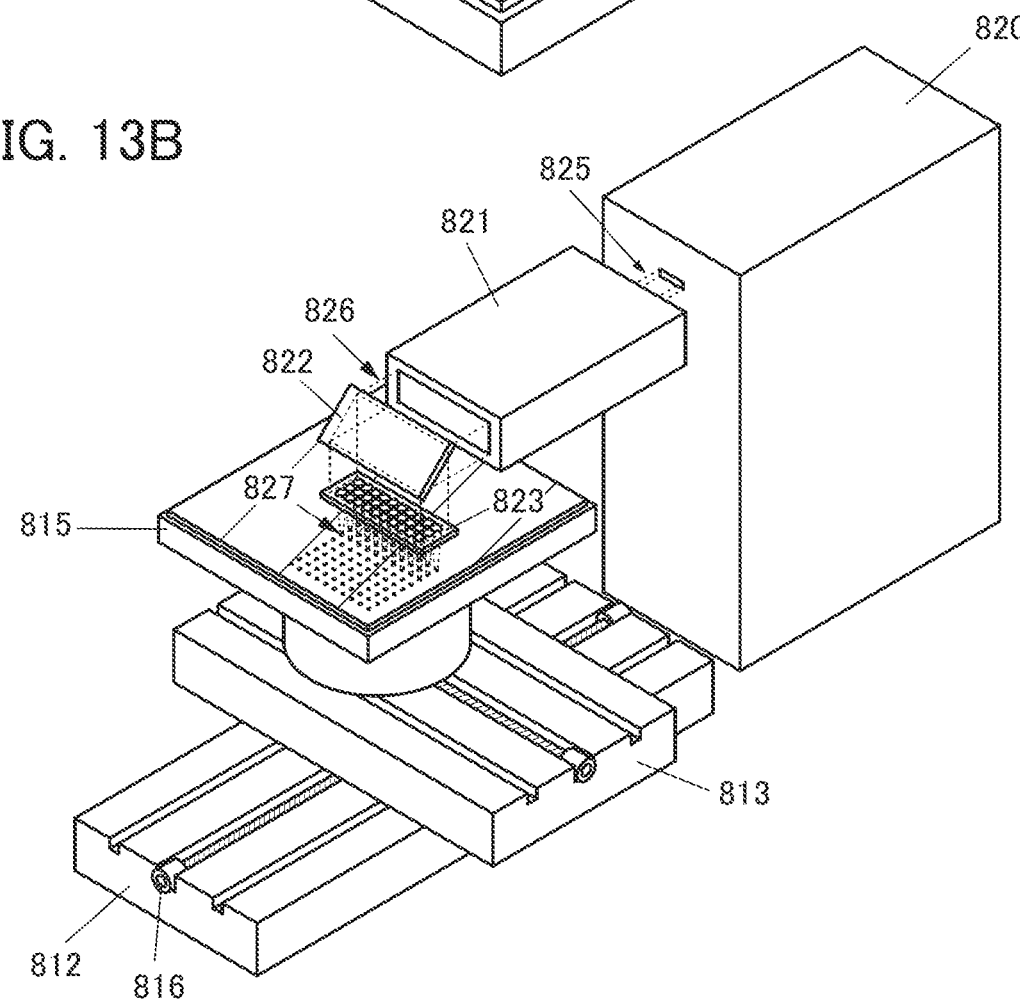

FIG. 13B is a perspective view illustrating a main structure of a laser crystallization apparatus which can be used in the above local laser irradiation step. The laser crystallization apparatus includes a moving mechanism 812, a moving mechanism 813, and the stage 815 which are components of an X-Y stage. The crystallization apparatus further includes a laser oscillator 820, the optical system unit 821, the mirror 822, and the microlens array 823 to shape the laser beam 827.

The moving mechanism 812 and the moving mechanism 813 each have a function of performing reciprocating linear motion in the horizontal direction. As a mechanism for powering the moving mechanism 812 and the moving mechanism 813, a ball screw mechanism 816 driven by a motor can be used, for example. The moving directions of the moving mechanism 812 and the moving mechanism 813 cross orthogonally; thus, the stage 815 fixed to the moving mechanism 813 can be moved in the X direction and in the Y direction freely.

The stage 815 includes a fixing mechanism such as a vacuum suction mechanism and can fix the substrate 830 or the like. Furthermore, the stage 815 may include a heating mechanism as needed. Although not illustrated, the stage 815 may include a pusher pin and a vertical moving mechanism thereof, and the substrate 830 or the like can be moved up and down when being transferred.

The laser oscillator 820 is preferably a pulsed laser, but may be a CW laser as long as it outputs light with a wavelength and intensity suitable for the purpose of processing. Typically, an excimer laser that emits ultraviolet light with a wavelength of 351 nm to 353 nm (XeF), a wavelength of 308 nm (XeCl), or the like can be used. Alternatively, a second harmonic wavelength (515 nm, 532 nm, or the like) or a third harmonic wavelength (343 nm, 355 nm, or the like) of a solid-state laser such as a YAG laser or a fiber laser may be used. A plurality of laser oscillators 820 may be provided.

The optical system unit 821 includes a mirror, a beam expander, a beam homogenizer, or the like, for example, and can homogenize and expand the energy in-plane distribution of laser light 825 emitted from the laser oscillator 820.

As the mirror 822, a dielectric multilayer mirror can be used, for example, and is provided so that the incident angle of the laser light is substantially 45°. The microlens array 823 can have a shape such that a plurality of convex lenses are provided on the top surface or on the top and bottom surfaces of a quartz board, for example.

With the above-described laser crystallization apparatus, polycrystalline silicon layers with small variation in crystallinity can be formed.

At least part of this embodiment can be implemented in combination with any of the other embodiments described in this specification as appropriate.

Embodiment 4

In this embodiment, a hybrid display which is one embodiment of the present invention will be described.

Note that a hybrid display method is a method for displaying a plurality of lights in one pixel or one sub-pixel to display a letter and/or an image. A hybrid display is an aggregate that displays a plurality of lights in one pixel or one sub-pixel included in a display portion to display a letter and/or an image.

As an example of the hybrid display method, a method in which first light and second light are displayed with different timings in one pixel or one sub-pixel can be given. At this time, in one pixel or one sub-pixel, the first light and the second light having the same color tone (any one of red, green, and blue, or any one of cyan, magenta, and yellow) can be displayed at the same time, and a letter and/or an image can be displayed on a display portion.

As another example of the hybrid display method, a method in which reflected light and self-emission light are displayed in one pixel or one sub-pixel can be given. Reflected light and self-emission light (e.g., light emitted from an organic light-emitting diode (OLED) and light emitted from a light-emitting diode (LED)) having the same color tone can be displayed at the same time in one pixel or one sub-pixel.

Note that in a hybrid display method, a plurality of lights may be displayed in not one pixel or one sub-pixel but adjacent pixels or adjacent sub-pixels. Furthermore, displaying first light and second light at the same time means displaying the first light and the second light for the same length of time to the extent that flickering is not perceived by a viewer's eye. As long as flickering is not perceived by a viewer's eye, the display period of the first light may deviate from the display period of the second light.

Moreover, the hybrid display is an aggregate that includes a plurality of display elements in one pixel or one sub-pixel and in which each of the plurality of display elements performs display in the same period. The hybrid display includes the plurality of display elements and active elements for driving the display elements in one pixel or one sub-pixel. As the active elements, switches, transistors, thin film transistors, or the like can be given. The active element is connected to each of the plurality of display elements, so that display of the plurality of display elements can be individually controlled.

Note that in this specification and the like, a display method satisfying any one or a plurality of the above-described structures is referred to as hybrid display. The display controller 1101 in Embodiment 1 can control hybrid display.

Furthermore, a hybrid display includes a plurality of display elements in one pixel or one sub-pixel. Note that as the plurality of display elements, reflective elements that reflect light and self-luminous elements that emit light can be given, for example. Note that the reflective element and the self-luminous element can be controlled independently. A hybrid display has a function of displaying a letter and/or an image using one or both of reflected light and self-emitted light in a display portion.

The display device of one embodiment of the present invention can include a pixel in which a first display element that reflects visible light is provided. Alternatively, the display device can include a pixel in which a second display element that emits visible light is provided. Alternatively, the display device can include a pixel in which such a first display element and such a second display element are provided.

In this embodiment, a display device including a first display element that reflects visible light and a second display element that emits visible light is described.

The display device has a function of displaying an image utilizing first light reflected from the first display element and/or second light emitted from the second display element. Alternatively, the display device has a function of expressing grayscales by individually controlling the amount of the first light reflected from the first display element and the amount of the second light emitted from the second display element.

The display device preferably includes a first pixel that expresses grayscales by controlling the amount of light reflected from the first display element and a second pixel that expresses grayscales by controlling the amount of light emitted from the second display element. For example, the first pixels and the second pixels are arranged in a matrix to form a display portion.

It is preferable that the first pixels and the second pixels be the same in number and be arranged with the same pitch in a display region. Here, the adjacent first and second pixels can be collectively referred to as a pixel unit. Accordingly, as described later, an image displayed by only a plurality of first pixels, an image displayed by only a plurality of second pixels, and an image displayed by both the plurality of first pixels and the plurality of second pixels can be displayed in the same display region.

As the first display element included in the first pixel, an element that performs display by reflecting external light can be used. Such an element does not include a light source, and thus, the power consumption for display can be significantly reduced.

As the first display element, typically, a reflective liquid crystal element can be used. Alternatively, as the first display element, a microelectromechanical systems (MEMS) shutter element, an optical interference type MEMS element, an element to which a microcapsule method, an electrophoretic method, an electrowetting method, an Electronic Liquid Powder (registered trademark) method, or the like is applied, or the like can be used.

As the second display element included in the second pixel, an element that performs display by utilizing light from its own light source can be used. Specifically, it is preferable to use an electroluminescent element in which light emission can be extracted from a light-emitting substance by application of an electric field. Since the luminance and the chromaticity of light emitted from such a pixel are not affected by external light, display with high color reproducibility (a wide color gamut) and high contrast can be performed; that is, a clear image can be displayed.

As the second display element, a self-luminous light-emitting element such as an OLED, a light-emitting diode (LED), a quantum-dot light-emitting diode (QLED), or a semiconductor laser can be used. Alternatively, a combination of a backlight that serves as a light source and a transmissive liquid crystal element that controls the amount of light from the backlight transmitted therethrough may be used as the display element included in the second pixel.

The first pixel can include, for example, a sub-pixel exhibiting white (W) or sub-pixels each exhibiting light of corresponding one of three colors, red (R), green (G), and blue (B). Similarly, the second pixel can include, for example, a sub-pixel exhibiting white (W) or sub-pixels each exhibiting light of corresponding one of three colors, red (R), green (G), and blue (B). Note that the first pixel and the second pixel may each include sub-pixels of four or more colors. As the number of kinds of sub-pixels is increased, the power consumption can be reduced and the color reproducibility can be improved.

In one embodiment of the present invention, the display mode can be switched between a first mode in which an image is displayed by the first pixels, a second mode in which an image is displayed by the second pixels, and a third mode in which an image is displayed by the first pixels and the second pixels. Different image signals may be input to the first pixels and the second pixels so that a composite image can be displayed.

In the first mode, an image is displayed using light reflected from the first display element. The first mode, which requires no light source, is a driving mode with extremely low power consumption. For example, the first mode is effective in the case where external light is white or near-white light with sufficiently high illuminance. The first mode is a display mode suitable for displaying text data of a book, a document or the like. The use of reflected light enables eye-friendly display, thereby mitigating eye strain.

In the second mode, an image is displayed utilizing light emitted from the second display element. Thus, an extremely clear image can be displayed (display with high contrast and high color reproducibility can be performed) regardless of the illuminance and the chromaticity of external light. For example, the second mode is effective when the illuminance of external light is extremely low, e.g., during the night or in a dark room. When a bright image is displayed under weak external light, a user may feel that the image is too bright. To prevent this, an image with reduced luminance is preferably displayed in the second mode. Thus, excessive brightness can be suppressed, and the power consumption can be reduced. The second mode is suitable for displaying a clear image, a smooth moving image, or the like.

In the third mode, display is performed utilizing both light reflected from the first display element and light emitted from the second display element. Specifically, in the driving mode, light from the first pixel and light from the second pixel adjacent to the first pixel are mixed to express one color. An image can be displayed more clearly than in the first mode, and the power consumption can be lower than that in the second mode. For example, the third mode is effective when the illuminance of external light is relatively low, e.g., under indoor illumination or in the morning or evening, or when the external light does not represent a white chromaticity.

A more specific example of one embodiment of the present invention will be described below with reference to drawings.

[Structure Example of Display Device]

Figure 15:
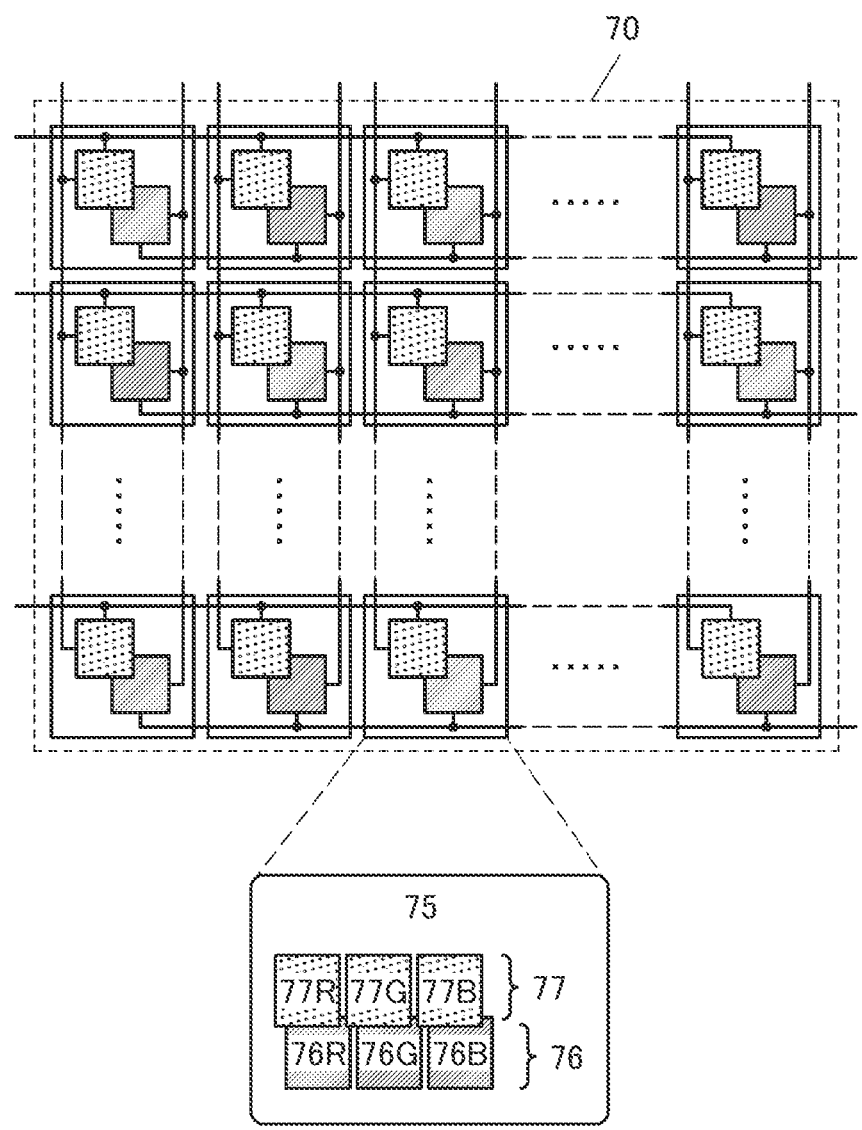
FIG. 15 illustrates pixel units.

FIG. 15 illustrates a display region 70 included in the display device according to one embodiment of the present invention. The display region 70 includes a plurality of pixel units 75 arranged in a matrix. The pixel units 75 each include a pixel 76 and a pixel 77.

FIG. 15 shows an example in which the pixel 76 and the pixel 77 each include display elements corresponding to three colors of red (R), green (G), and blue (B).

The pixel 76 includes a display element 76R corresponding to red (R), a display element 76G corresponding to green (G), and a display element 76B corresponding to blue (B). The display elements 76R, 76G, and 76B are second display elements utilizing light from a light source.

The pixel 77 includes a display element 77R corresponding to red (R), a display element 77G corresponding to green (G), and a display element 77B corresponding to blue (B). The display elements 77R, 77G, and 77B are first display elements utilizing reflection of external light.

The above is the description of the structure example of the display device.

[Structure Example of Pixel Unit]

Figure 16A:
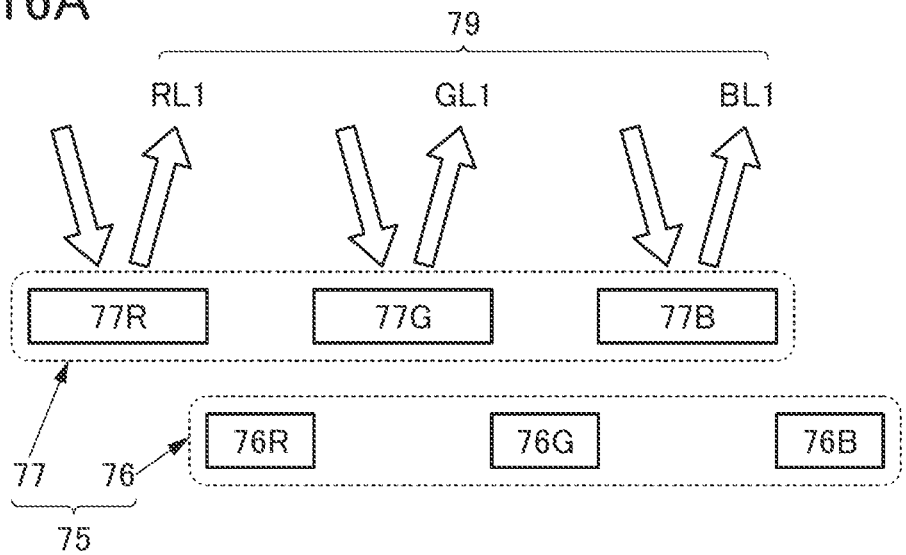
FIGS. 16A to 16C each illustrate a pixel unit.
Figure 16B:
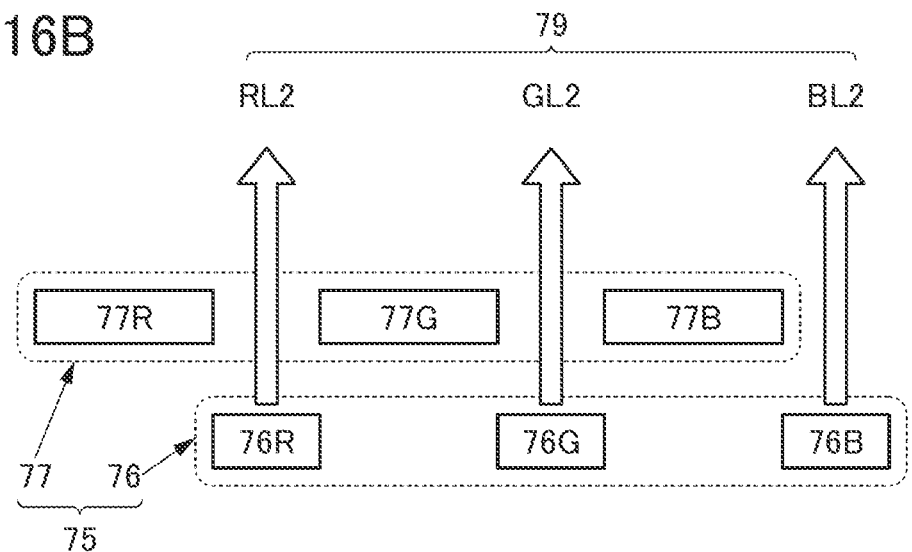
Figure 16C:
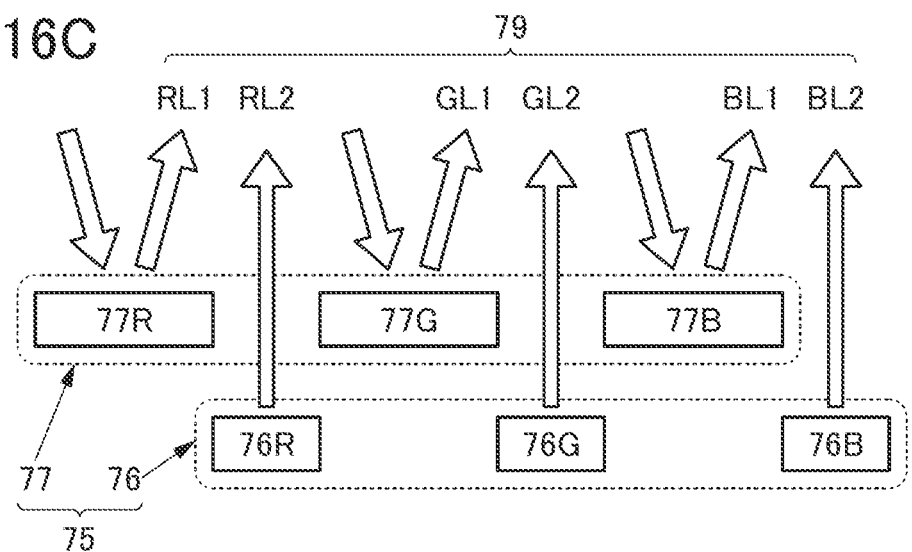

Next, the pixel unit 75 will be described with reference to FIGS. 16A to 16C. FIGS. 16A to 16C are schematic views illustrating structure examples of the pixel unit 75.

The pixel 76 includes the display element 76R, the display element 76G, and the display element 76B. The display element 76R includes a light source and emits, to the display surface side, red light RL2 with a luminance corresponding to the gray level of red included in a second gray level input to the pixel 76. Similarly, the display element 76G and the display element 76B emit green light GL2 and blue light BL2, respectively, to the display surface side.

The pixel 77 includes the display element 77R, the display element 77G, and the display element 77B. The display element 77R reflects external light, which is then extracted to the display surface side as red light RL1 with a luminance corresponding to the gray level of red included in a first gray level input to the pixel 77. Similarly, green light GL1 and blue light BL1 are extracted from the display element 77G and the display element 77B, respectively, to the display surface side.

<First Mode>

FIG. 16A shows an example of an operation mode in which an image is displayed by driving the display elements 77R, 77G, and 77B, which reflect external light. As illustrated in FIG. 16A, for example, in the case where the illuminance of external light is sufficiently high, the pixel 76 is not driven and only the colors of the light (the light RL1, the light GL1, and the light BL1) from the pixel 77 are mixed, whereby the light 79 of a predetermined color can be extracted from the pixel unit 75 to the display surface side. Thus, driving with extremely low power consumption can be performed.

<Second Mode>

FIG. 16B shows an example of an operation mode in which an image is displayed by driving the display elements 76R, 76G, and 76B. As illustrated in FIG. 16B, for example, in the case where the illuminance of external light is extremely low, the pixel 77 is not driven and only the colors of the light (the light RL2, the light GL2, and the light BL2) from the pixel 76 are mixed, whereby the light 79 of a predetermined color can be extracted from the pixel unit 75 to the display surface side. Thus, a clear image can be displayed. Furthermore, the luminance is reduced when the illuminance of external light is low, which can prevent glare for a user and reduce power consumption.

<Third Mode>

FIG. 16C shows an example of an operation mode in which an image is displayed by driving both the display elements 77R, 77G, and 77B, which reflect external light, and the display elements 76R, 76G, and 76B, which emit light. As illustrated in FIG. 16C, the six colors of the light, i.e., the light RL1, the light GL1, the light BL1, the light RL2, the light GL2, and the light BL2 are mixed, whereby the light 79 of a predetermined color can be extracted from the pixel unit 75 to the display surface side.

Accordingly, the display region 70 illustrated in FIG. 15 includes the pixel unit provided with light-emitting display elements and reflective display elements, which is favorable for displaying a selected region. For example, when the display region 70 is displayed with the reflective display elements, a selected region can be displayed with the light-emitting display elements. Furthermore, when the display region 70 is displayed with the light-emitting display elements, a selected region may be displayed with the reflective display elements. Alternatively, a selected region may be displayed by changing a grayscale data for the reflective display elements, or by changing the grayscale data for the light-emitting display elements.

The above is the description of the structure example of the pixel unit 75.

At least part of this embodiment can be implemented in combination with any of the other embodiments described in this specification as appropriate.

Embodiment 5

Hereinafter, a specific structure example of the hybrid display device described in Embodiment 4 will be described. The display panel described below as an example includes both a reflective liquid crystal element and a light-emitting element and can display an image both in a transmissive mode and in a reflective mode.

[Structure Example]

Figure 17A:
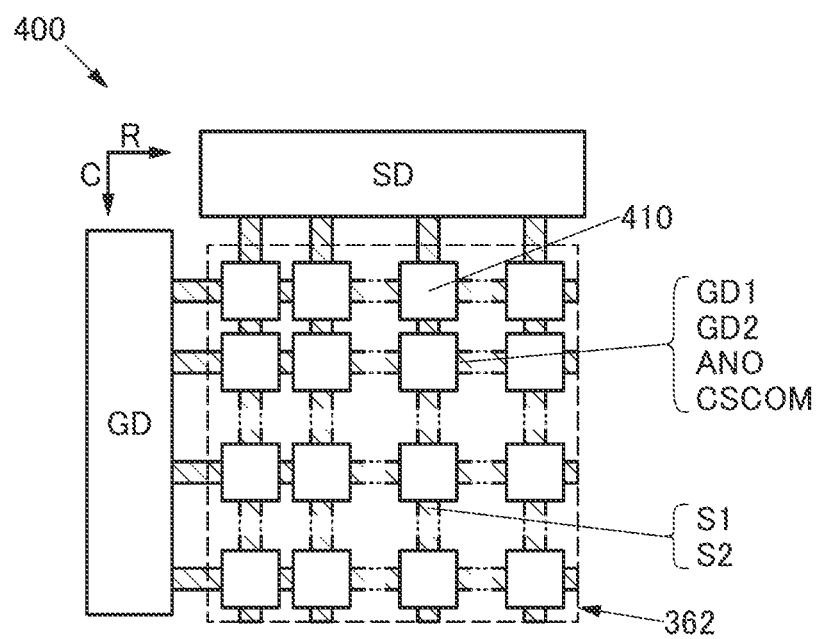
Figure 17A:
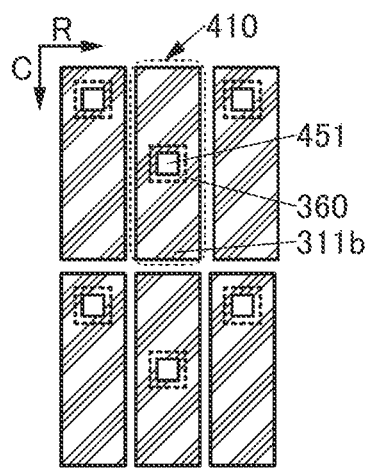
Figure 17A:
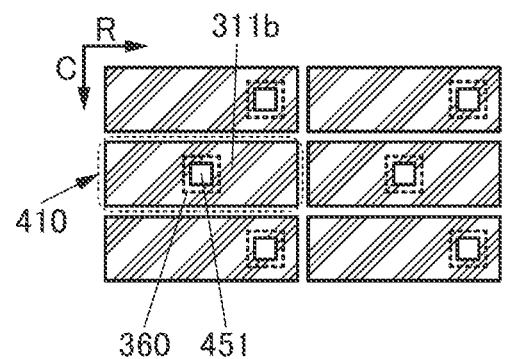

FIG. 17A is a block diagram illustrating a structure example of a display device 400. The display device 400 includes a plurality of pixels 410 arranged in a matrix in a display portion 362. Furthermore, the display device 400 includes a circuit GD and a circuit SD. Furthermore, the display device 400 includes a plurality of wirings GD1, a plurality of wirings GD2, a plurality of wirings ANO, and a plurality of wirings CSCOM which are electrically connected to the circuit GD and the plurality of pixels 410 arranged in the direction R. Furthermore, the display device 400 includes a plurality of wirings S1 and a plurality of wirings S2 which are electrically connected to the circuit SD and the plurality of pixels 410 arranged in the direction C.

Although one circuit GD and one circuit SD are provided here for simplicity, the circuit GD and the circuit SD for driving a liquid crystal element and the circuit GD and the circuit SD for driving a light-emitting element may be separately provided.

Each of the pixels 410 includes a reflective liquid crystal element and a light-emitting element. In the pixel 410, the liquid crystal element and the light-emitting element partly overlap with each other.

FIG. 17B1 illustrates a structure example of a conductive layer 311b included in the pixel 410. The conductive layer 311b functions as a reflective electrode of the liquid crystal element in the pixel 410. The conductive layer 311b has an opening 451.

The dashed line in FIG. 17B1 denotes a light-emitting element 360 positioned in a region overlapping with the conductive layer 311b. The light-emitting element 360 overlaps with the opening 451 of the conductive layer 311b. Thus, light emitted from the light-emitting element 360 is extracted to the display surface side through the opening 451.

In FIG. 17B1, the pixels 410 adjacent in the direction R are pixels of different colors. As illustrated in FIG. 17B1, the openings 451 in two pixels adjacent in the direction R are preferably provided in different positions in the conductive layers 311b so as not to be arranged in a line. This allows two adjacent light-emitting elements 360 to be apart from each other, thereby preventing light emitted from the light-emitting element 360 from entering a coloring layer included in the adjacent pixel 410 (such a phenomenon is also referred to as crosstalk). Furthermore, since two adjacent light-emitting elements 360 can be arranged apart from each other, a high-definition display device can be obtained even when EL layers of the light-emitting elements 360 are separately formed with a shadow mask or the like.

Alternatively, the arrangement illustrated in FIG. 17B2 may be employed.

If the ratio of the total area of the opening 451 to the total area excluding the opening is too large, display performed using the liquid crystal element is dark. If the ratio of the total area of the opening 451 to the total area excluding the opening is too small, display performed using the light-emitting element 360 is dark.

If the area of the opening 451 of the conductive layer 311b functioning as a reflective electrode is too small, the extraction efficiency of light emitted from the light-emitting element 360 is decreased.

The opening 451 may have a polygonal shape, a quadrangular shape, an elliptical shape, a circular shape, a cross shape, a stripe shape, a slit shape, or a checkered pattern, for example. The opening 451 may be provided close to the adjacent pixel. The opening 451 is preferably provided close to another pixel displaying the same color, in which case crosstalk can be suppressed.

[Circuit Configuration Example]

Figure 18:
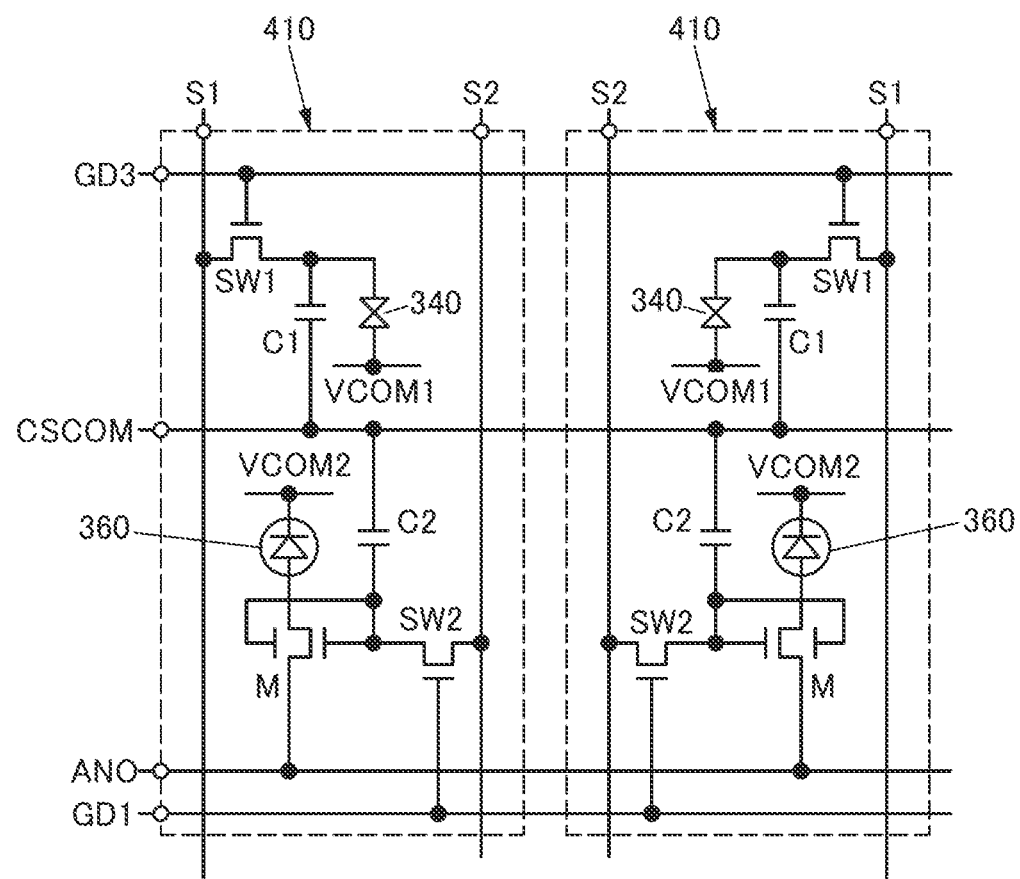
FIG. 18 illustrates a circuit of a display device.

FIG. 18 is a circuit diagram illustrating a configuration example of the pixel 410. FIG. 18 illustrates two adjacent pixels 410.

The pixel 410 includes a switch SW1, a capacitor C1, a liquid crystal element 340, a switch SW2, a transistor M, a capacitor C2, the light-emitting element 360, and the like. The pixel 410 is electrically connected to the wiring GD1, the wiring GD3, the wiring ANO, the wiring CSCOM, the wiring S1, and the wiring S2. FIG. 18 also illustrates a wiring VCOM1 which is electrically connected to the liquid crystal element 340 and a wiring VCOM2 which is electrically connected to the light-emitting element 360.

FIG. 18 illustrates an example in which transistors are used as the switches SW1 and SW2.

A gate of the switch SW1 is connected to the wiring GD3. One of a source and a drain of the switch SW1 is connected to the wiring S1, and the other of the source and the drain is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring GD1. One of a source and a drain of the switch SW2 is connected to the wiring S2, and the other of the source and the drain is connected to one electrode of the capacitor C2 and a gate of the transistor M. The other electrode of the capacitor C2 is connected to the wiring CSCOM. The other of the source and the drain of the transistor M is connected to one electrode of the light-emitting element 360. The other electrode of the light-emitting element 360 is connected to the wiring VCOM2.

FIG. 18 illustrates an example in which the transistor M includes two gates connected to each other with a semiconductor positioned therebetween. This structure can increase current that can flow through the transistor M.

The wiring GD3 can be supplied with a signal for changing the on/off state of the switch SW1. A predetermined potential can be supplied to the wiring VCOM1. The wiring S1 can be supplied with a signal for changing the alignment state of liquid crystal included in the liquid crystal element 340. A predetermined potential can be supplied to the wiring CSCOM.

The wiring GD1 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the reflective mode, for example, display can be performed by driving the pixel 410 in FIG. 18 with the signals supplied to the wiring GD3 and the wiring S1 and utilizing the optical modulation of the liquid crystal element 340. In the transmissive mode, display can be performed by driving the pixel with the signals supplied to the wiring GD1 and the wiring S2 to make the light-emitting element 360 emit light. In the case where both of the driving modes are combined, the pixel can be driven with the signals supplied to the wiring GD1, the wiring GD3, the wiring S1, and the wiring S2.

Figure 19A:
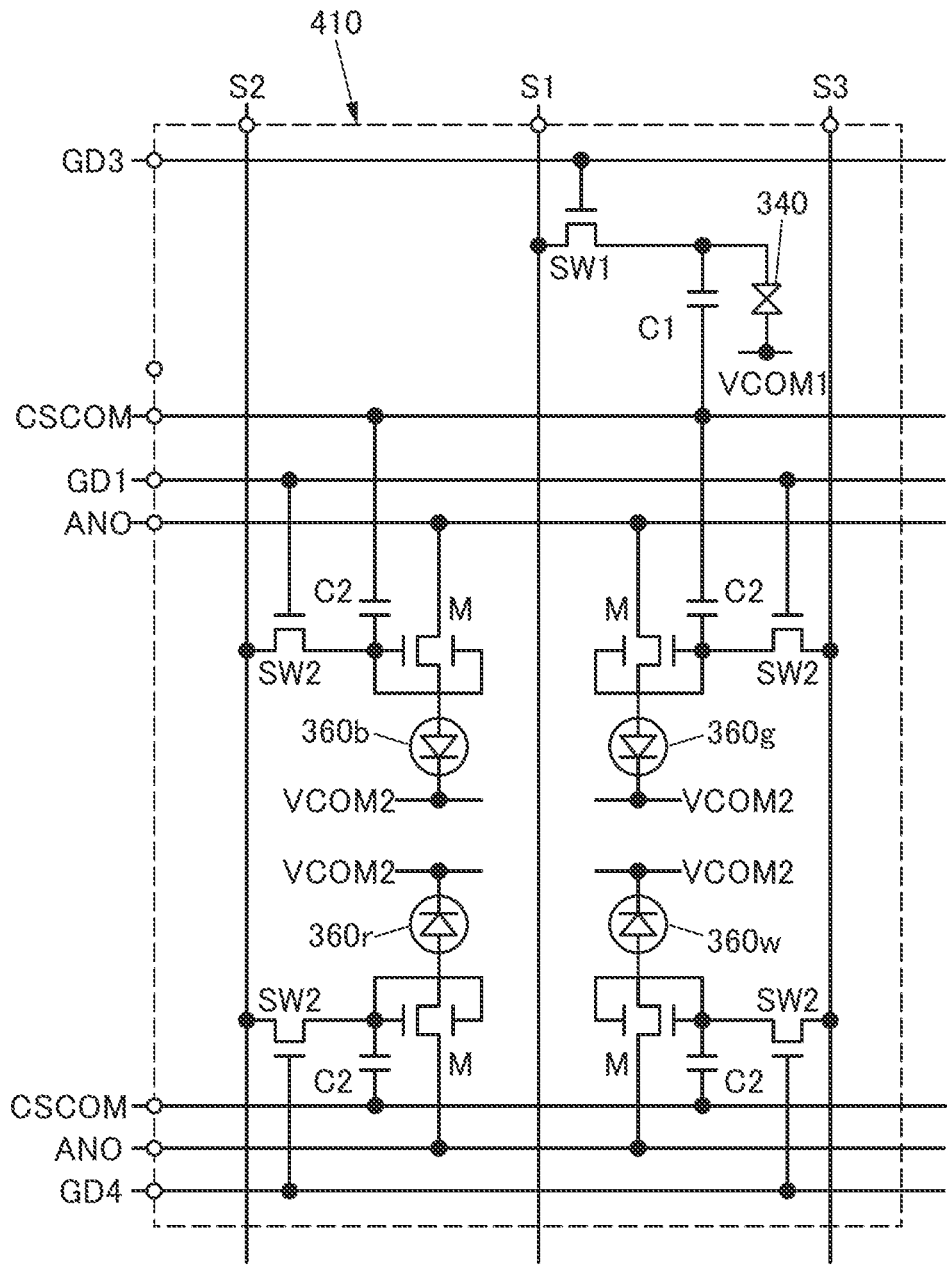
FIG. 19A illustrates a circuit of a display device and FIG. 19B is a top view of a pixel.

Note that one embodiment of the present invention is not limited to the example illustrated in FIG. 18, in which one pixel 410 includes one liquid crystal element 340 and one light-emitting element 360. FIG. 19A illustrates an example in which one pixel 410 includes one liquid crystal element 340 and four light-emitting elements 360 (light-emitting elements 360r, 360g, 360b, and 360w).

In FIG. 19A, in addition to the wirings in FIG. 18, a wiring GD4 and a wiring S3 are connected to the pixel 410.

In the example illustrated in FIG. 19A, for example, light-emitting elements which exhibit red (R), green (G), blue (B), and white (W) can be used as the four light-emitting elements 360. A reflective liquid crystal element which exhibits white can be used as the liquid crystal element 340. This enables white display with high reflectivity in the reflective mode. This also enables low-power display with excellent color-rendering properties in the transmissive mode.

Figure 19B:
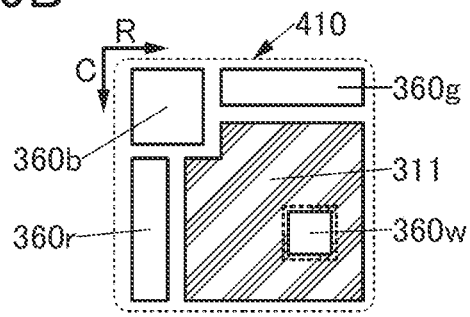

FIG. 19B illustrates a structure example of the pixel 410. The pixel 410 includes the light-emitting element 360w which overlaps with an opening of an electrode 311 and the light-emitting elements 360r, 360g, and 360b which are located in the periphery of the electrode 311. It is preferable that the light-emitting elements 360r, 360g, and 360b have substantially the same light-emitting area.

[Structure Example of Display Panel]

Figure 20:
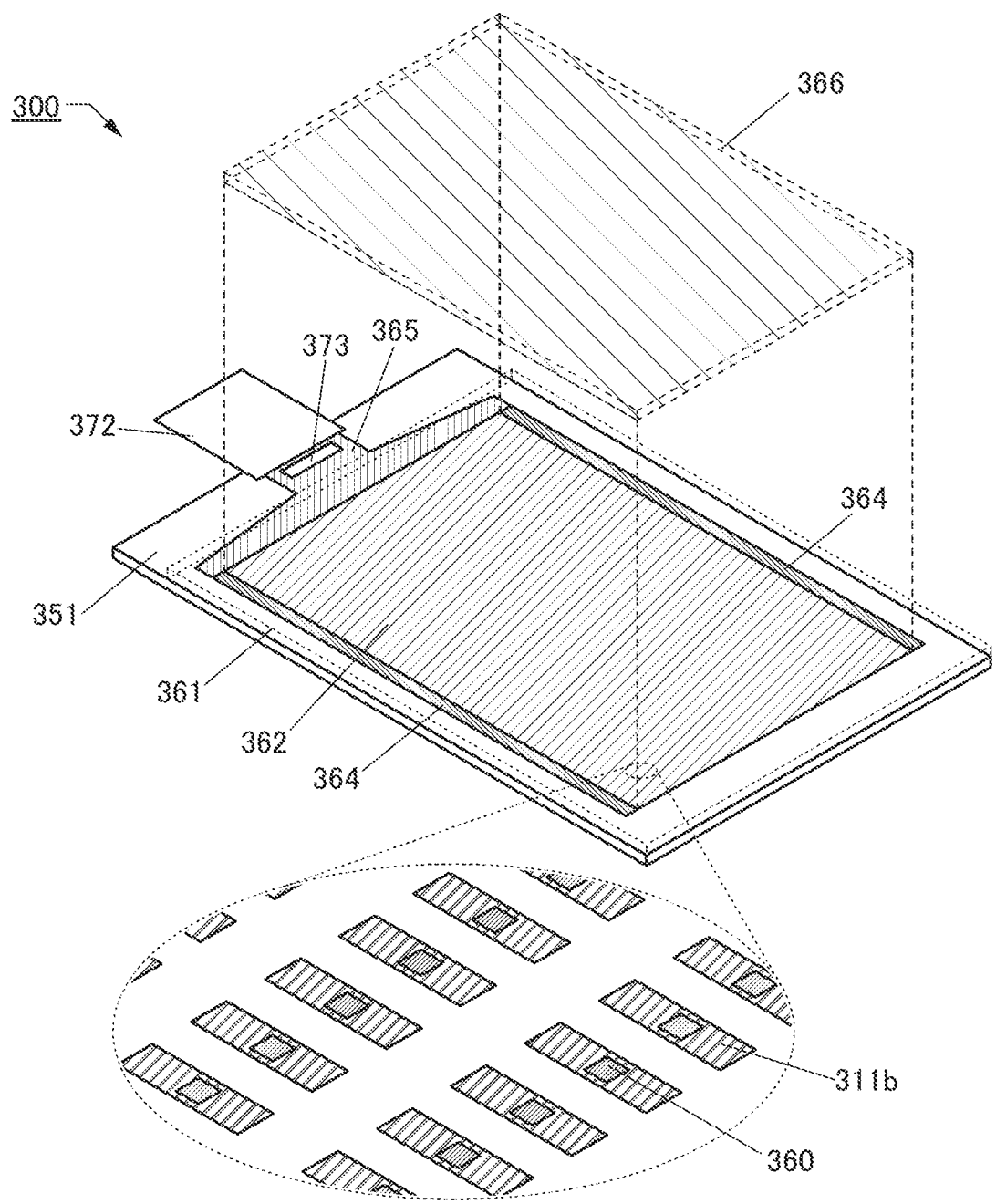
FIG. 20 illustrates a structure of a display device.

FIG. 20 is a schematic perspective view of a display panel 300 of one embodiment of the present invention. In the display panel 300, a substrate 351 and a substrate 361 are attached to each other. In FIG. 20, the substrate 361 is denoted by a dashed line.

The display panel 300 includes a display portion 362, a circuit 364, a wiring 365, and the like. For example, the substrate 351 is provided with the circuit 364, the wiring 365, and the conductive layer 311b that functions as a pixel electrode. FIG. 20 illustrates an example in which an IC 373 and an FPC 372 are mounted on the substrate 351. Thus, the structure illustrated in FIG. 20 can be referred to as a display module including the display panel 300, the FPC 372, and the IC 373.

As the circuit 364, for example, a circuit functioning as a scan line driver circuit can be used.

The wiring 365 has a function of supplying signals and power to the display portion and the circuit 364. The signals and the power are input to the wiring 365 from the outside through the FPC 372 or from the IC 373.

FIG. 20 illustrates an example in which the IC 373 is provided over the substrate 351 by a chip on glass (COG) method or the like. As the IC 373, for example, an IC functioning as a scan line driver circuit or a signal line driver circuit can be used. Note that the IC 373 may be omitted, for example, when the display panel 300 includes circuits functioning as a scan line driver circuit and a signal line driver circuit or when circuits functioning as a scan line driver circuit and a signal line driver circuit are externally provided and signals for driving the display panel 300 are input through the FPC 372. Alternatively, the IC 373 may be mounted on the FPC 372 by a chip on film (COF) method or the like.

FIG. 20 illustrates an enlarged view of part of the display portion 362. The conductive layers 311b included in a plurality of display elements are arranged in a matrix in the display portion 362. The conductive layer 311b has a function of reflecting visible light and serves as a reflective electrode of the liquid crystal element 340 described later.

As illustrated in FIG. 20, the conductive layer 311b has an opening. The light-emitting element 360 is positioned closer to the substrate 351 than the conductive layer 311b is. Light is emitted from the light-emitting element 360 to the substrate 361 side through the opening of the conductive layer 311b.

Furthermore, an input device 366 can be provided over the substrate 361. For example, a sheet-like capacitive touch sensor may be provided so as to overlap with the display portion 362. Alternatively, the touch sensor may be provided between the substrate 361 and the substrate 351. In the case where the touch sensor is provided between the substrate 361 and the substrate 351, an optical touch sensor including a photoelectric conversion element as well as a capacitive touch sensor may be used.

[Cross-Sectional Structure Example 1]

Figure 21:
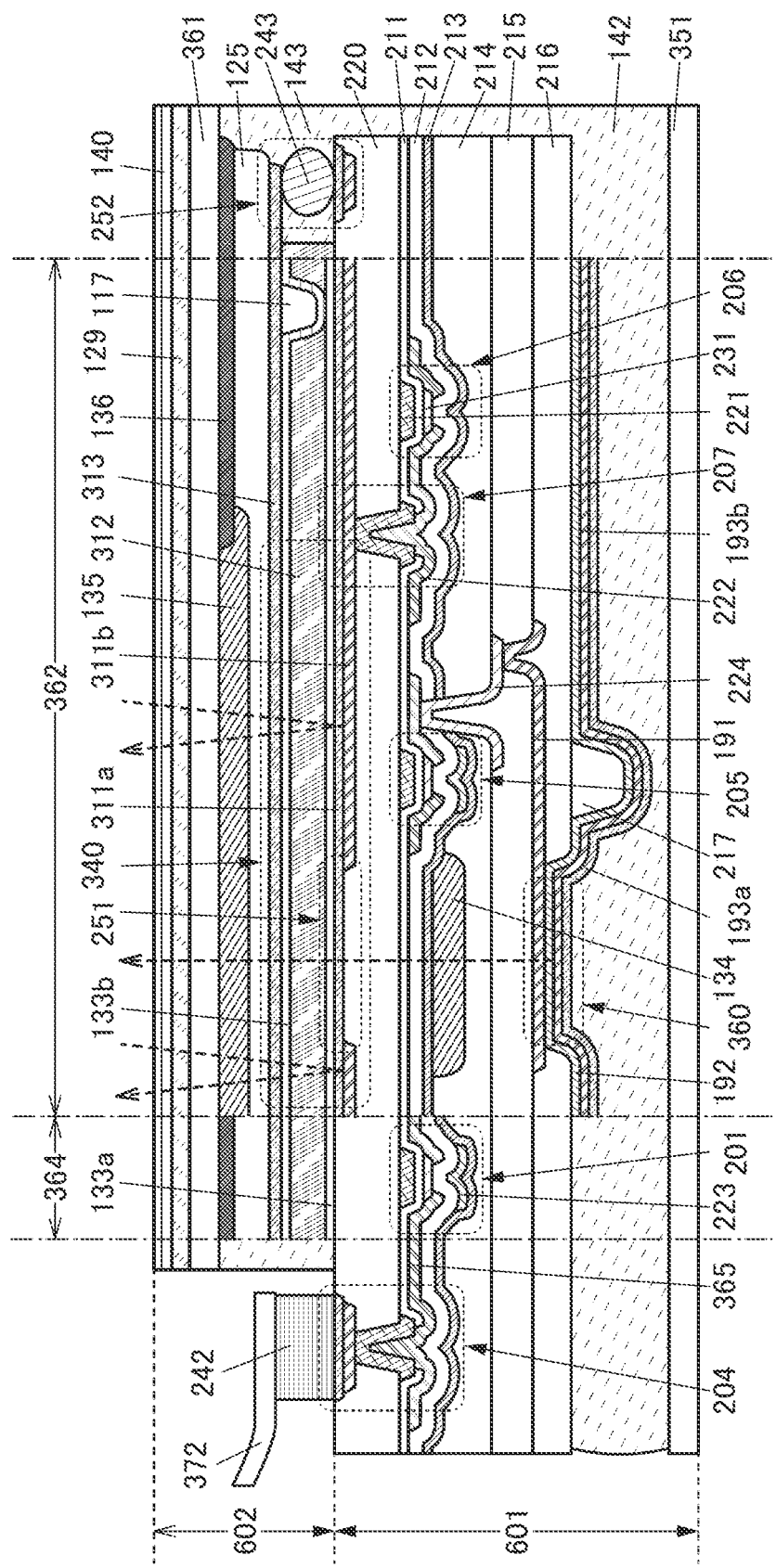
FIG. 21 illustrates a structure of a display device.

FIG. 21 illustrates an example of cross sections of part of a region including the FPC 372, part of a region including the circuit 364, and part of a region including the display portion 362 of the display panel illustrated as an example in FIG. 20.

The display panel includes an insulating layer 220 between the substrate 351 and the substrate 361. The light-emitting element 360, a transistor 201, a transistor 205, a transistor 206, a coloring layer 134, and the like are provided between the substrate 351 and the insulating layer 220. The liquid crystal element 340, a coloring layer 135, and the like are provided between the insulating layer 220 and the substrate 361. The substrate 361 and the insulating layer 220 are attached to each other with an adhesive layer 143. The substrate 351 and the insulating layer 220 are attached to each other with an adhesive layer 142.

The transistor 206 is electrically connected to the liquid crystal element 340, and the transistor 205 is electrically connected to the light-emitting element 360. The transistor 205 and the transistor 206, which are both formed on a surface of the insulating layer 220 on the substrate 351 side, can be formed through the same process.

The substrate 361 is provided with the coloring layer 135, a light-blocking layer 136, an insulating layer 125, a conductive layer 313 functioning as a common electrode of the liquid crystal element 340, an alignment film 133b, an insulating layer 117, and the like. The insulating layer 117 functions as a spacer for holding a cell gap of the liquid crystal element 340.

Insulating layers such as an insulating layer 211, an insulating layer 212, an insulating layer 213, an insulating layer 214, and an insulating layer 215 are provided on the substrate 351 side of the insulating layer 220. Part of the insulating layer 211 functions as a gate insulating layer of each transistor. The insulating layer 212, the insulating layer 213, and the insulating layer 214 are provided to cover the transistors. The insulating layer 215 is provided to cover the insulating layer 214. The insulating layer 214 and the insulating layer 215 each function as a planarization layer. Note that here, the three insulating layers, the insulating layer 212, the insulating layer 213, and the insulating layer 214, are provided to cover the transistors and the like; however, the number of insulating layers is not limited to three and may be one, two, or four or more. The insulating layer 214 functioning as a planarization layer is not necessarily provided.

The transistor 201, the transistor 205, and the transistor 206 each include a conductive layer 221 part of which functions as a gate, conductive layers 222 part of which functions as a source and a drain, and a semiconductor layer 231. Here, a plurality of layers obtained by processing the same conductive film is shown with the same hatching pattern.

The liquid crystal element 340 is a reflective liquid crystal element. The liquid crystal element 340 has a structure in which a conductive layer 370, liquid crystal 312, and the conductive layer 313 are stacked. The conductive layer 311b that reflects visible light is provided in contact with a surface of the conductive layer 370 on the substrate 351 side. The conductive layer 311b has an opening 251. The conductive layer 370 and the conductive layer 313 each contain a material that transmits visible light. In addition, an alignment film 133a is provided between the liquid crystal 312 and the conductive layer 370, and the alignment film 133b is provided between the liquid crystal 312 and the conductive layer 313.

A light diffusion plate 129 and a polarizing plate 140 are provided on an outer surface of the substrate 361. As the polarizing plate 140, a linear polarizing plate or a circularly polarizing plate can be used. An example of a circularly polarizing plate is a stack of a linear polarizing plate and a quarter-wave retardation plate. Such a structure can suppress reflection of external light. The light diffusion plate 129 is provided to suppress reflection of external light. The cell gap, alignment, drive voltage, and the like of the liquid crystal element used as the liquid crystal element 340 are adjusted depending on the kind of the polarizing plate so that desirable contrast is obtained.

In the liquid crystal element 340, the conductive layer 311b has a function of reflecting visible light, and the conductive layer 313 has a function of transmitting visible light. Light entering from the substrate 361 side is polarized by the polarizing plate 140, passes through the conductive layer 313 and the liquid crystal 312, and is reflected by the conductive layer 311b. Then, the light passes through the liquid crystal 312 and the conductive layer 313 again and reaches the polarizing plate 140. In this case, optical modulation of the light can be controlled by controlling the alignment of the liquid crystal with a voltage applied between the conductive layer 311b and the conductive layer 313. That is, the intensity of light extracted through the polarizing plate 140 can be controlled. Light other than that in a particular wavelength region is absorbed by the coloring layer 135, so that red light is extracted, for example.

The light-emitting element 360 is a bottom-emission light-emitting element. The light-emitting element 360 has a structure in which a conductive layer 191, an EL layer 192, and a conductive layer 193b are stacked in this order from the insulating layer 220 side. In addition, a conductive layer 193a is provided to cover the conductive layer 193b. The conductive layer 193b contains a material that reflects visible light, and the conductive layer 191 and the conductive layer 193a each contain a material that transmits visible light. Light is emitted from the light-emitting element 360 to the substrate 361 side through the coloring layer 134, the insulating layer 220, the opening 251, the conductive layer 313, and the like.

Here, as illustrated in FIG. 21, the opening 251 is preferably provided with the conductive layer 370 which transmits visible light. Accordingly, the liquid crystal 312 is aligned in a region overlapping with the opening 251 as well as in the other region; therefore, an alignment defect of the liquid crystal in a boundary portion between these regions, which might cause undesired light leakage, can be suppressed.

An insulating layer 217 is provided over the insulating layer 216 which covers an end portion of the conductive layer 191. The insulating layer 217 functions as a spacer that prevents the substrate 351 from being unnecessarily close to the insulating layer 220. In addition, in the case where the EL layer 192 or the conductive layer 193a is formed using a shielding mask (metal mask), the insulating layer 217 may have a function of preventing the shielding mask from being in contact with a surface on which the EL layer 192 or the conductive layer 193a is to be formed. Note that the insulating layer 217 is not necessarily provided.

One of a source and a drain of the transistor 205 is electrically connected to the conductive layer 191 of the light-emitting element 360 through a conductive layer 224.

One of a source and a drain of the transistor 206 is electrically connected to the conductive layer 311b through a connection portion 207. The conductive layer 311b and the conductive layer 370 are in contact with and electrically connected to each other. In the connection portion 207, the conductive layers provided on both surfaces of the insulating layer 220 are connected to each other through an opening of the insulating layer 220.

A connection portion 204 is provided in a region in which the substrate 351 and the substrate 361 do not overlap with each other. The connection portion 204 is electrically connected to the FPC 372 through a connection layer 242. The connection portion 204 has a structure similar to that of the connection portion 207. On the top surface of the connection portion 204, a conductive layer obtained by processing the same conductive film as the conductive layer 370 is exposed. Thus, the connection portion 204 and the FPC 372 can be electrically connected to each other through the connection layer 242.

A connection portion 252 is provided in part of a region in which the adhesive layer 143 is provided. In the connection portion 252, a conductive film as the conductive layer 370 is electrically connected to part of the conductive layer 313 through a connector 243. Accordingly, a signal or a potential input from the FPC 372 connected on the substrate 351 side can be supplied to the conductive layer 313 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 243, a material capable of elastic deformation or plastic deformation is preferably used. As illustrated in FIG. 21, the connector 243 which is a conductive particle has a vertically crushed shape in some cases. Accordingly, the contact area between the connector 243 and a conductive layer electrically connected to the connector 243 is increased, so that contact resistance can be reduced and problems such as disconnection can be suppressed.

The connector 243 is preferably provided so as to be covered with the adhesive layer 143. For example, the connector 243 may be dispersed in the adhesive layer 143 which is not cured yet.

FIG. 21 illustrates an example of the circuit 364 in which the transistor 201 is provided.

In FIG. 21, for example, the transistor 201 and the transistor 205 each have a structure in which the semiconductor layer 231 in which a channel is formed is provided between two gates. One of the gates is formed using the conductive layer 221, and the other gate is formed using a conductive layer 223 which overlaps with the semiconductor layer 231 with the insulating layer 212 positioned therebetween. Such a structure enables the control of the threshold voltage of the transistor. In this case, the two gates may be connected to each other and supplied with the same signal to operate the transistor. Such a transistor can have a higher field-effect mobility and a higher on-state current than other transistors. Consequently, a circuit capable of high-speed operation can be formed. Furthermore, the area occupied by a circuit portion can be reduced. The use of the transistor having a high on-state current can reduce signal delay in wirings and suppress display unevenness even when the number of wirings is increased owing to an increase in the size or resolution of the display panel.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material inhibiting diffusion of impurities such as water and hydrogen is preferably used for at least one of the insulating layers 212 and 213 which cover the transistors. That is, the insulating layer 212 or the insulating layer 213 can function as a barrier film. Such a structure can effectively suppress diffusion of the impurities into the transistors from the outside, and thus, a highly reliable display panel can be provided.

The insulating layer 125 is provided on the substrate 361 side to cover the coloring layer 135 and the light-blocking layer 136. The insulating layer 125 may function as a planarization layer. The insulating layer 125 enables the conductive layer 313 to have a substantially flat surface, resulting in a uniform alignment state of the liquid crystal 312.

[Cross-Sectional Structure Example 2]

Figure 22:
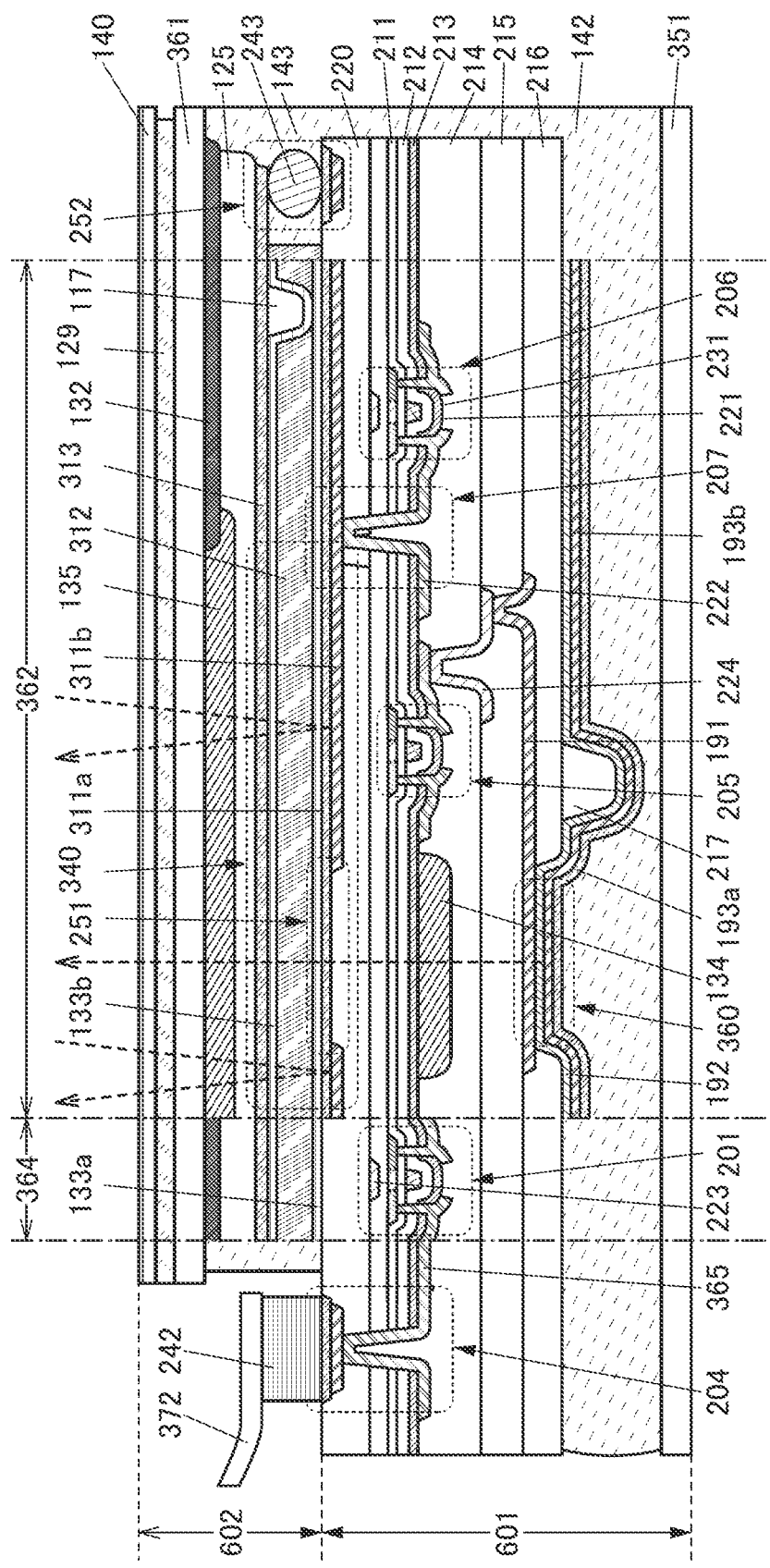
FIG. 22 illustrates a structure of a display device.

FIG. 22 illustrates an example of a display panel in which a top-gate transistor is used as each transistor in the structure illustrated in FIG. 21. The use of a top-gate transistor can reduce parasitic capacitance, leading to an increase in the frame frequency of display.

A transistor included in the display device of one embodiment of the present invention includes a conductive layer functioning as a gate electrode, a semiconductor layer, a conductive layer functioning as a source electrode, a conductive layer functioning as a drain electrode, and an insulating layer functioning as a gate insulating layer. Note that there is no particular limitation on the structure of the transistor.

As a semiconductor material used for the transistor, a metal oxide whose energy gap is greater than or equal to 2 eV, preferably greater than or equal to 2.5 eV, further preferably greater than or equal to 3 eV can be used. As a typical example, an oxide semiconductor containing indium can be given.

A transistor including an oxide semiconductor which has a wider bandgap and a lower carrier density than silicon has a low off-state current; therefore, charge accumulated in a capacitor that is series-connected to the transistor can be retained for a long time.

As the semiconductor layer, for example, a film represented by an In-M-Zn-based oxide which contains indium, zinc, and M (a metal such as aluminum, titanium, gallium, germanium, yttrium, zirconium, lanthanum, cerium, tin, neodymium, or hafnium), an In-M-based oxide, an M-Zn-based oxide, or an In—Zn-based oxide can be used.

In the case where the oxide semiconductor included in the semiconductor layer is an In-M-Zn-based oxide, the atomic ratio of metal elements in a sputtering target used for depositing the In-M-Zn-based oxide preferably satisfies In≥M and Zn≥M. The atomic ratio of metal elements in such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio of metal elements in the deposited semiconductor layer may deviate from the above atomic ratio of metal elements in the sputtering target within a range of ±40%.

A metal oxide containing the above material or the like can function as a light-transmitting conductor by adjusting impurities, oxygen vacancies, and the like. Thus, when the components of the transistor such as the source electrode, the drain electrode, and the gate electrode, in addition to the semiconductor layer, are formed using a light-transmitting conductor, a light-transmitting transistor can be fabricated. The use of the light-transmitting transistor in a pixel of a display device allows light passing through a display element or light emitted from the display element to pass through the transistor; thus, the aperture ratio can be improved.

Figure 23:
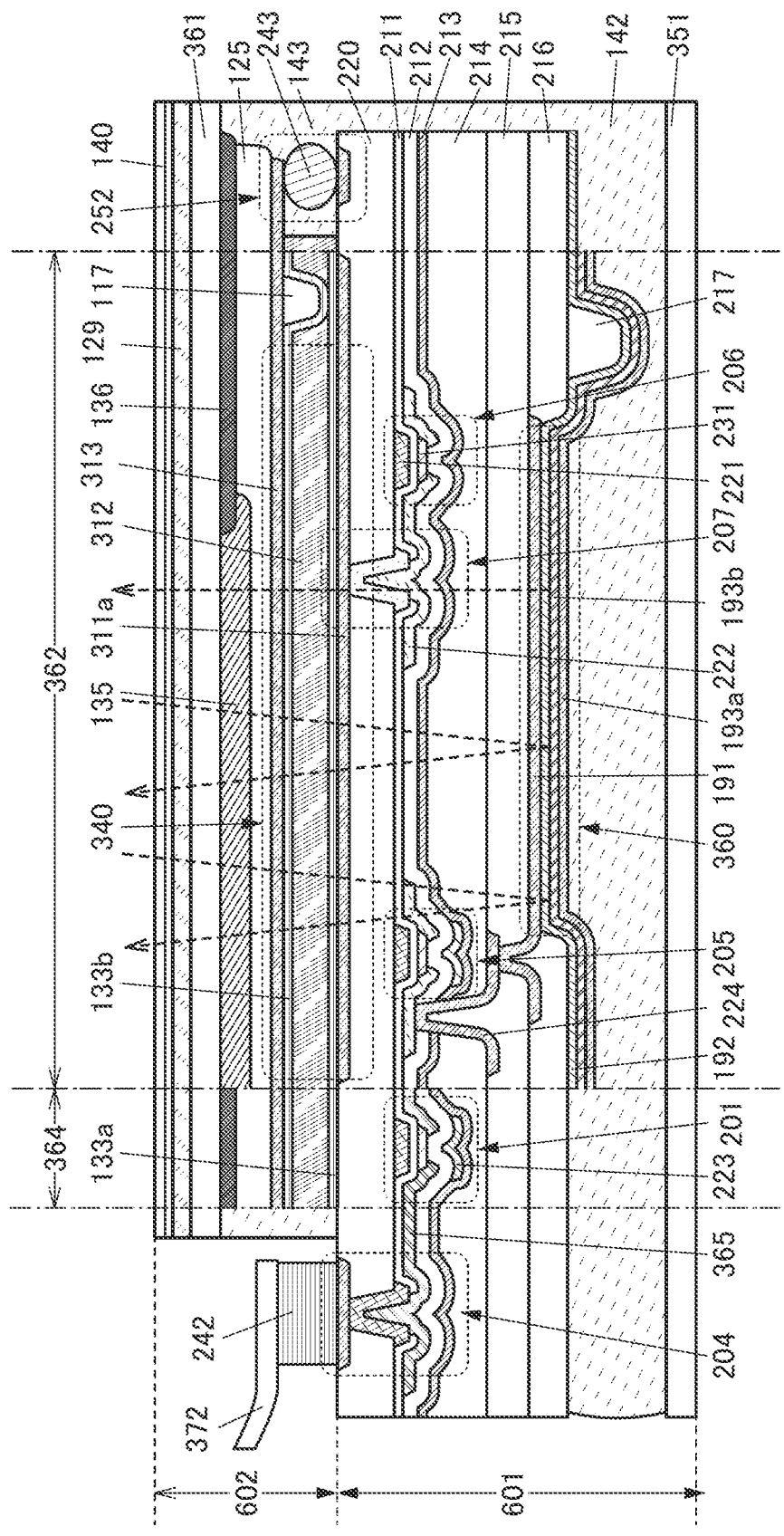
FIG. 23 illustrates a structure of a display device.

For example, as in a modification example of Cross-sectional structure example 1 illustrated in FIG. 23, components of the transistors 205 and 206 and the connection portion 207 can be formed using the light-transmitting conductor. When the conductive layer 311b is not provided in the structure in Cross-sectional structure example 1, light emitted from the light-emitting element 360 can pass through part or the whole of the transistors 205 and 206 and the connection portion 207. Furthermore, light entering from the substrate 361 side and passing through the liquid crystal 312 can be reflected by the conductive layer 193b. To improve the reliability of the transistors 205 and 206, one or both of a conductive layer functioning as a gate electrode and a conductive layer functioning as a backgate electrode may be formed using a material that does not have a light-transmitting property, such as metal.

Silicon may be used as a semiconductor in which a channel of the transistor is formed. Although amorphous silicon may be used as silicon, silicon having crystallinity is particularly preferable. For example, microcrystalline silicon, polycrystalline silicon, or single crystal silicon is preferably used. In particular, polycrystalline silicon can be formed at a lower temperature than single crystal silicon and has a higher field-effect mobility and a higher reliability than amorphous silicon.

At least part of this embodiment can be implemented in combination with any of the other embodiments described in this specification as appropriate.

Embodiment 6

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. That is, a metal oxide that has at least one of an amplifying function, a rectifying function, and a switching function can be called a metal oxide semiconductor, or OS for short. In addition, an OS FET refers to a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification and the like, "c-axis aligned crystal (CAAC)" or "cloud-aligned composite (CAC)" may be stated in some cases. Note that CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used for a channel region of a transistor, the transistor in the on state can have a high current drive capability, that is, a high on-state current and a high field-effect mobility.

In other words, the CAC-OS or the CAC metal oxide can also be called a matrix composite or a metal matrix composite.

<Composition of CAC-OS>

Described below is the composition of a CAC-OS applicable to a transistor disclosed in one embodiment of the present invention.

The CAC-OS has, for example, a composition in which elements included in an oxide semiconductor are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, a high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility (μ) can be achieved.

A semiconductor element including a CAC-OS has high reliability. Thus, the CAC-OS is suitably used in a variety of semiconductor devices typified by a display.

At least part of this embodiment can be implemented in combination with any of the other embodiments described in this specification as appropriate.

Embodiment 7

In this embodiment, electronic devices of embodiments of the present invention will be described with reference to the drawing.

Each of the electronic devices described below is provided with a display device of one embodiment of the present invention in a display portion. Thus, the electronic devices achieve high resolution. In addition, the electronic devices can achieve both high resolution and a large screen.

The display portion of the electronic device of one embodiment of the present invention can display, for example, an image with a resolution of full high definition, 4K2K, 8K4K, 16K8K, or more. As a screen size of the display portion, the diagonal size can be greater than or equal to 20 inches, greater than or equal to 30 inches, greater than or equal to 50 inches, greater than or equal to 60 inches, or greater than or equal to 70 inches.

Examples of the electronic devices include electronic devices with a relatively large screen, such as a television device, a desktop or laptop personal computer, a monitor of a computer or the like, a digital signage, and a large game machine (e.g., a pachinko machine); a camera such as a digital camera or a digital video camera; a digital photo frame; a mobile phone; a portable game console; a portable information terminal; and an audio reproducing device.

The electronic device or a lighting device of one embodiment of the present invention can be incorporated along a curved inside/outside wall surface of a house or a building or a curved interior/exterior surface of a car.

The electronic device of one embodiment of the present invention may include an antenna. When a signal is received by the antenna, the electronic device can display an image, information, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays).

The electronic device of one embodiment of the present invention can have a variety of functions such as a function of displaying a variety of information (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Figure 24A:
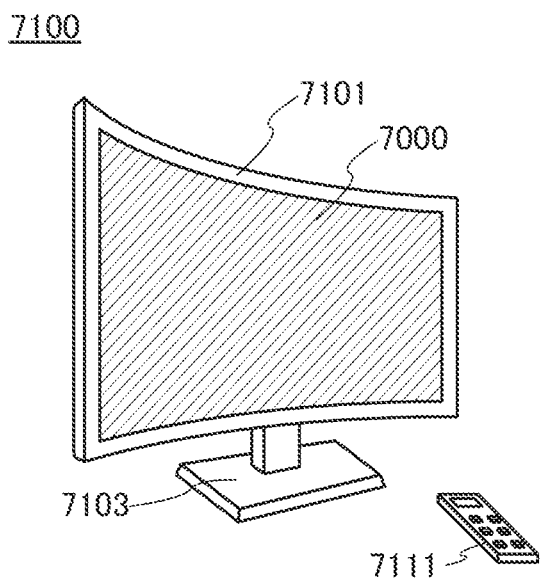
FIGS. 24A to 24F illustrate electronic devices.

FIG. 24A illustrates an example of a television device. In a television device 7100, a display portion 7000 is incorporated in a housing 7101. Here, the housing 7101 is supported by a stand 7103.

The display device of one embodiment of the present invention can be used in the display portion 7000.

The television device 7100 illustrated in FIG. 24A can be operated with an operation switch provided in the housing 7101 or a separate remote controller 7111. Furthermore, the display portion 7000 may include a touch sensor. The television device 7100 can be operated by touching the display portion 7000 with a finger or the like. Furthermore, the remote controller 7111 may be provided with a display portion for displaying information output from the remote controller 7111. With operation keys or a touch panel of the remote controller 7111, channels and volume can be controlled and images displayed on the display portion 7000 can be controlled.

Note that the television device 7100 is provided with a receiver, a modem, and the like. With use of the receiver, general television broadcasting can be received. When the television device is connected to a communication network with or without wires via the modem, one-way (from a transmitter to a receiver) or two-way (between a transmitter and a receiver or between receivers) information communication can be performed.

Figure 24B:
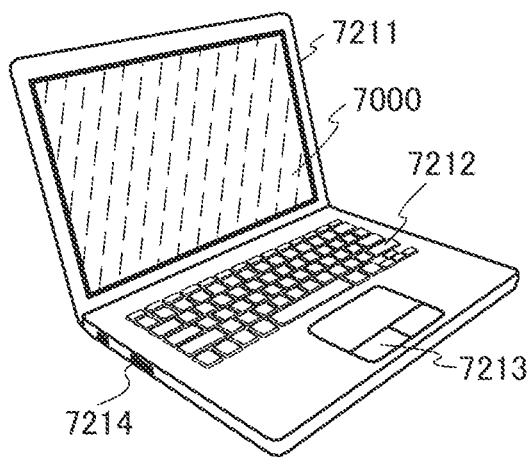

FIG. 24B illustrates a laptop personal computer 7200. The laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 24C:
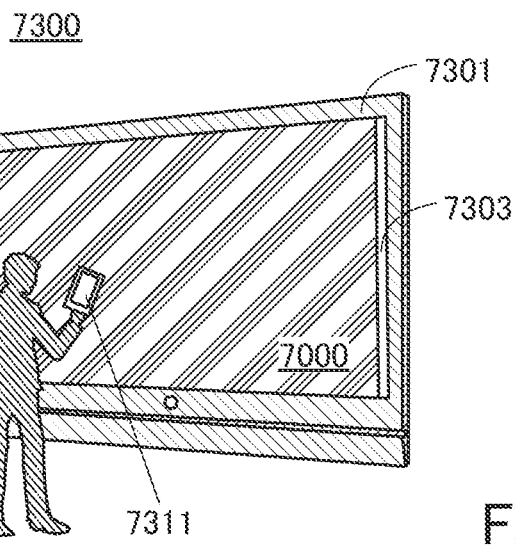
Figure 24D:
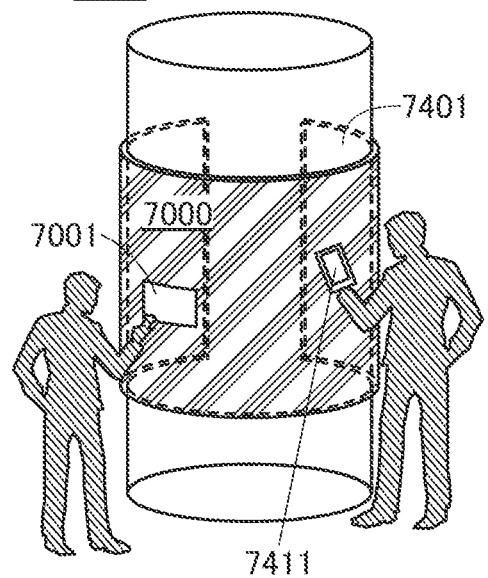

FIGS. 24C and 24D illustrate examples of the digital signage.

A digital signage 7300 illustrated in FIG. 24C includes a housing 7301, the display portion 7000, a speaker 7303, and the like. Also, the digital signage 7300 can include an LED lamp, operation keys (including a power switch or an operation switch), a connection terminal, a variety of sensors, a microphone, and the like.

FIG. 24D illustrates a digital signage 7400 mounted on a cylindrical pillar 7401. The digital signage 7400 includes the display portion 7000 provided along a curved surface of the pillar 7401.

The display device of one embodiment of the present invention can be used in each of the display portions 7000 illustrated in FIGS. 24C and 24D.

A larger area of the display portion 7000 can provide more information at a time. In addition, the larger display portion 7000 attracts more attention, so that the effectiveness of the advertisement can be increased, for example. The display portion 7000 preferably includes a touch panel. By touching part of the display portion 7000, a user can obtain specific information displayed in a display region 7001 of the display portion 7000.

The use of the touch panel in the display portion 7000 is preferable because in addition to display of a still or moving image on the display portion 7000, intuitive operation by a user is possible. In the case where the display device is used for providing information such as route or traffic information, usability can be enhanced by intuitive operation.

Furthermore, as illustrated in FIGS. 24C and 24D, it is preferable that the digital signage 7300 or the digital signage 7400 work with an information terminal 7311 or an information terminal 7411 such as a smartphone a user has through wireless communication. For example, information of an advertisement displayed on the display portion 7000 can be displayed on a screen of the information terminal 7311 or 7411. Moreover, by operation of the information terminal 7311 or 7411, a displayed image on the display portion 7000 can be switched.

Furthermore, it is possible to make the digital signage 7300 or 7400 execute a game with use of the screen of the information terminal 7311 or 7411 as an operation means (controller or a touch panel). Thus, an unspecified number of people can join in and enjoy the game concurrently.

Figure 24E:
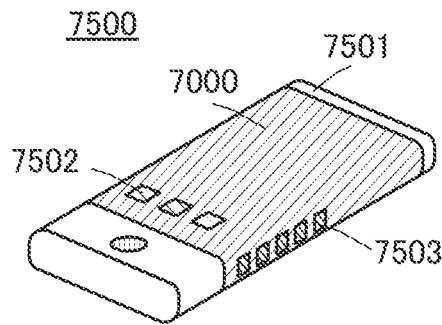

FIG. 24E is a perspective view of a portable information terminal 7500. The portable information terminal functions as, for example, one or more of a telephone set, a notebook, and an information browsing system. Specifically, the portable information terminal can be used as a smartphone. The portable information terminal illustrated in this embodiment is capable of executing, for example, a variety of applications such as mobile phone calls, e-mailing, reading and editing texts, music reproduction, Internet communication, and a computer game.

The portable information terminal 7500 can display characters, image information, and the like on its plurality of surfaces. For example, as illustrated in FIG. 24E, three operation keys 7502 can be displayed on one surface, and information 7503 indicated by a rectangle can be displayed on another surface. The operation keys 7502 displayed on the display portion 7000 may be operated through a touch panel. FIG. 24E illustrates an example in which information is displayed on a side surface of the portable information terminal. Information may be displayed on three or more surfaces of the portable information terminal.

Examples of the information include notification from a social networking service (SNS), display indicating reception of an e-mail or an incoming call, the subject of an e-mail or the like, the sender of an e-mail or the like, the date, the time, remaining battery level, and the reception strength of an antenna. Alternatively, the operation key, an icon, or the like may be displayed in place of the information.

Figure 24F:
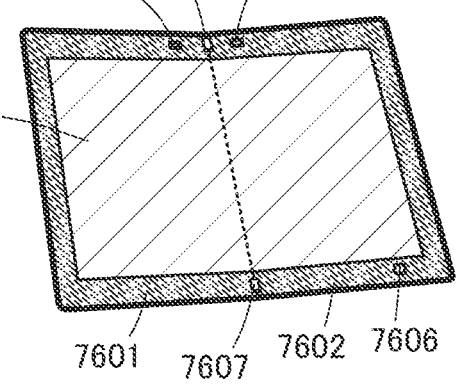

FIG. 24F illustrates a tablet personal computer, which includes a housing 7601, a housing 7602, the display portion 7000 of one embodiment of the present invention, an optical sensor 7604, an optical sensor 7605, a switch 7606, and the like. The display portion 7000 is supported by the housing 7601 and the housing 7602. The display portion 7000 is formed using a flexible substrate and therefore has a function of being bent flexibly.

By changing the angle between the housing 7601 and the housing 7602 with a hinge 7607 and a hinge 7608, the display portion 7000 can be folded such that the housing 7601 and the housing 7602 overlap with each other. Although not illustrated, an open/close sensor may be incorporated so that the above-described angle change can be used as information about conditions of use of the tablet personal computer. The display portion 7000 of one embodiment of the present invention, which is used in the tablet personal computer, can display a high-quality image regardless of the intensity of external light in an operating environment and achieve low power consumption.

At least part of this embodiment can be implemented in combination with any of the other embodiments described in this specification as appropriate.

REFERENCE NUMERALS

BL1: light BL2: light C1: capacitor C2: capacitor D1: distance D2: distance G1: wiring G2: wiring G3: wiring GD1: wiring GD2: wiring GD3: wiring GD4: wiring GL1: light GL2: light RL1: light RL2: light S1: wiring S2: wiring S3: wiring SW1: switch SW2: switch VCOM1: wiring VCOM2: wiring 11: substrate 12: substrate 20: liquid crystal element 21: conductive layer 22: liquid crystal 23: conductive layer 24a: alignment film 24b: alignment film 26: insulating layer 30: transistor 31: conductive layer 31a: conductive layer 32: semiconductor layer 32p: semiconductor layer 33a: conductive layer 33b: conductive layer 33c: conductive layer 33d: conductive layer 34: insulating layer 35: impurity semiconductor layer 37: semiconductor layer 38: connection portion 39a: polarizing plate 39b: polarizing plate 41: coloring layer 42: light-blocking layer 60: capacitor 70: display region 75: pixel unit 76: pixel 76B: display element 76G: display element 76R: display element 77: pixel 77B: display element 77G: display element 77R: display element 79: light 81: insulating layer 82: insulating layer 83: insulating layer 84: insulating layer 90: backlight unit 117: insulating layer 125: insulating layer 129: light diffusion plate 133a: alignment film 133b: alignment film 134: coloring layer 135: coloring layer 136: light-blocking layer 140: polarizing plate 142: adhesive layer 143: adhesive layer 191: conductive layer 192: EL layer 193a: conductive layer 193b: conductive layer 201: transistor 204: connection portion 205: transistor 206: transistor 207: connection portion 211: insulating layer 212: insulating layer 213: insulating layer 214: insulating layer 215: insulating layer 216: insulating layer 217: insulating layer 220: insulating layer 221: conductive layer 222: conductive layer 223: conductive layer 224: conductive layer 231: semiconductor layer 242: connection layer 243: connector 251: opening 252: connection portion 300: display panel 311: electrode 311b: conductive layer 312: liquid crystal 313: conductive layer 340: liquid crystal element 351: substrate 360: light-emitting element 360b: light-emitting element 360g: light-emitting element 360r: light-emitting element 360w: light-emitting element 361: substrate 362: display portion 364: circuit 365: wiring 366: input device 370: conductive layer 372: FPC 373: IC 400: display device 410: pixel 451: opening 812: moving mechanism 813: moving mechanism 815: stage 816: ball screw mechanism 820: laser oscillator 821: optical system unit 822: mirror 823: microlens array 824: mask 825: laser light 826: laser light 827: laser beam 830: substrate 840: amorphous silicon layer 841: polycrystalline silicon layer 1000: electronic device 1011: processor 1012: memory device 1013: input device 1014: clock generation circuit 1015: speaker 1016: microphone 1100: display device 1101: display controller 1102: display panel 1111: decoder circuit 1112: hash generation circuit 1113: frame memory 1114: image processing circuit 1115: hash control circuit 1115a: EOF detection circuit 1115b: memory 1116: comparison circuit 1116a: comparison control circuit 1116b: memory 1117: timing control circuit 1121: data server 1122: external memory device 1130: latch circuit 1131: arithmetic circuit 1132: adder circuit 1133: memory 7000: display portion 7001: display region 7100: television device 7101: housing 7103: stand 7111: remote controller 7200: laptop personal computer 7211: housing 7212: keyboard 7213: pointing device 7214: external connection port 7300: digital signage 7301: housing 7303: speaker 7311: information terminal 7400: digital signage 7401: pillar 7411: information terminal 7500: portable information terminal 7502: operation key 7503: information 7601: housing 7602: housing 7604: optical sensor 7605: optical sensor 7606: switch 7607: hinge This application is based on Japanese Patent Application Serial No. 2017-010511 filed with Japan Patent Office on Jan. 24, 2017, the entire contents of which are hereby incorporated by reference.

The invention claimed is:

1. A display device comprising:
a display panel comprising a first pixel and a second pixel adjacent to the first pixel, the first pixel and the second pixel being in the same row; and
a display controller comprising a hash generation circuit, a hash control circuit, a comparison circuit, a timing control circuit configured to supply a control signal to the display panel, and an image processing circuit,
wherein the hash generation circuit is configured to generate a first hash value from first display data and a second hash value from second display data, and supply the first display data and the second display data to a frame memory,
wherein the hash control circuit is configured to determine the first hash value and the second hash value,
wherein the comparison circuit is configured to compare the first hash value with the second hash value, activate the timing control circuit when the first hash value is different from the second hash value, and stop operation of the timing control circuit when the first hash value is the same as the second hash value so that display of the display panel is not updated,
wherein the timing control circuit is configured to activate the image processing circuit so that image processing is performed on the second display data stored in the frame memory,
wherein the image processing circuit is configured to transmit the processed second display data to the display panel so that display of the display panel is updated,
wherein the hash generation circuit comprises an arithmetic circuit, and
wherein the arithmetic circuit is configured to calculate an integral of display data of the first pixel and not to calculate an integral of display data of the second pixel.

2. The display device according to claim 1,
wherein the hash generation circuit is configured to regularly sample first coordinate data of the pixel included in the first display data to generate the first hash value, and
wherein the hash generation circuit is configured to regularly sample the first coordinate data of the pixel included in the second display data to generate the second hash value.

3. The display device according to claim 1, wherein the hash generation circuit is configured to add a first weight coefficient to the first display data to generate the first hash value, and add a second weight coefficient to the second display data to generate the second hash value.

4. The display device according to claim 1,
wherein the pixel comprises a sub-pixel,
wherein the first display data comprises first sub-display data,
wherein the second display data comprises second sub-display data, and
wherein the hash generation circuit is configured to generate a first sub-hash value from the first sub-display data and a second sub-hash value from the second sub-display data.

5. The display device according to claim 4,
wherein the hash generation circuit is configured to regularly sample second coordinate data of the sub-pixel included in the first sub-display data to generate the first sub-hash value, and
wherein the hash generation circuit is configured to regularly sample the second coordinate data of the sub-pixel included in the second sub-display data to generate the second sub-hash value.

6. The display device according to claim 4, wherein the hash generation circuit is configured to add a third weight coefficient to the first sub-display data to generate the first sub-hash value, and add a fourth weight coefficient to the second sub-display data to generate the second sub-hash value.

7. The display device according to claim 1,
wherein each of the display controller and the display panel comprises a transistor, and
wherein the transistor comprises amorphous silicon or polycrystalline silicon in a semiconductor layer.

8. The display device according to claim 1,
wherein each of the display controller and the display panel comprises a transistor, and
wherein the transistor comprises a metal oxide in a semiconductor layer.

9. A display module comprising the display device according to claim 1.

10. An electronic device comprising the display device according to claim 1.

11. A display device comprising:
a display panel comprising a first pixel and a second pixel adjacent to the first pixel, the first pixel and the second pixel being in the same row; and
a display controller comprising a hash generation circuit, a comparison circuit, and a timing control circuit configured to supply a control signal to the display panel,
wherein the hash generation circuit is configured to generate a first hash value from first display data and supply the first display data to a frame memory,
wherein the comparison circuit is configured to compare the first hash value with a second hash value, activate the timing control circuit when the first hash value is different from the second hash value, and stop operation of the timing control circuit when the first hash value is the same as the second hash value so that display of the display panel is not updated,
wherein the hash generation circuit comprises an arithmetic circuit, and
wherein the arithmetic circuit is configured to calculate an integral of display data of the first pixel and not to calculate an integral of display data of the second pixel.

12. The display device according to claim 11, wherein the hash generation circuit is configured to regularly sample first coordinate data of the pixel included in the first display data to generate the first hash value.

13. The display device according to claim 11, wherein the hash generation circuit is configured to add a first weight coefficient to the first display data to generate the first hash value.

14. The display device according to claim 11,
wherein each of the display controller and the display panel comprises a transistor, and
wherein the transistor comprises amorphous silicon or polycrystalline silicon in a semiconductor layer.

15. The display device according to claim 11,
wherein each of the display controller and the display panel comprises a transistor, and
wherein the transistor comprises a metal oxide in a semiconductor layer.

16. A display module comprising the display device according to claim 11.

17. An electronic device comprising the display device according to claim 11.

* * * * *